United States Patent
Rokuhara et al.

(10) Patent No.: US 12,350,927 B2
(45) Date of Patent: Jul. 8, 2025

(54) RECORDING APPARATUS AND METHOD FOR SUPPRESSING DEVIATION OF RECORDING POSITION OF RECORDING APPARATUS

(71) Applicant: SEIKO EPSON CORPORATION, Tokyo (JP)

(72) Inventors: Noritsuna Rokuhara, Suwa (JP); Hiroyuki Maeda, Matsumoto (JP)

(73) Assignee: Seiko Epson Corporation, Tokyo (JP)

( * ) Notice: Subject to any disclaimer, the term of this patent is extended or adjusted under 35 U.S.C. 154(b) by 139 days.

(21) Appl. No.: 18/156,285

(22) Filed: Jan. 18, 2023

(65) Prior Publication Data

US 2023/0226830 A1   Jul. 20, 2023

(30) Foreign Application Priority Data

Jan. 19, 2022   (JP) ................. 2022006302

(51) Int. Cl.
*B41J 11/00*   (2006.01)
*B41J 3/60*   (2006.01)
(Continued)

(52) U.S. Cl.
CPC .......... *B41J 11/003* (2013.01); *B41J 3/60* (2013.01); *B41J 11/0055* (2013.01); *B41J 11/007* (2013.01); *B41J 11/0095* (2013.01); *B41J 11/58* (2013.01); *B41J 29/38* (2013.01); *H05K 5/0018* (2022.08)

(58) Field of Classification Search
CPC ........ B41J 11/003; B41J 3/60; B41J 11/0055; B41J 11/007; B41J 11/0095; B41J 11/58; B41J 29/38; B41J 13/103; H05K 5/0018; B65H 1/266; B65H 2511/12;
(Continued)

(56) References Cited

U.S. PATENT DOCUMENTS 8,636,277 B1 *   1/2014   Blair .................. B65H 3/06
                                              271/171
2013/0074720 A1   3/2013   Yamauchi
(Continued)

FOREIGN PATENT DOCUMENTS

| CN | 108274896 | 7/2018 |
| JP | 2013-071357 A | 4/2013 |
| JP | 2017-193071 A | 10/2017 |

*Primary Examiner* — Douglas X Rodriguez
*Assistant Examiner* — Tracey M McMillion
(74) *Attorney, Agent, or Firm* — WORKMAN NYDEGGER

(57) ABSTRACT

A recording apparatus includes a cassette or a feeding tray that is configured to mount a medium thereon, a transport unit that transports the medium mounted on the cassette or the feeding tray, and a recording head that performs recording on the medium. Furthermore, the recording apparatus includes a medium detection device and a deviation amount acquisition section. The medium detection device detects at least one of both side edges in a width direction intersecting a transport direction of the medium that is transported from the cassette or the feeding tray (step S12). The deviation amount acquisition section acquires a deviation amount of the recording head in the width direction of the medium based on at least one side edge detection position detected by the medium detection device (step S13).

13 Claims, 14 Drawing Sheets

(51) Int. Cl.
*B41J 11/58* (2006.01)
*B41J 29/38* (2006.01)
*H05K 5/00* (2006.01)

(58) Field of Classification Search
CPC ............ B65H 2511/22; B65H 2511/24; B65H 2801/06; B65H 1/04
See application file for complete search history.

(56) References Cited

U.S. PATENT DOCUMENTS

2017/0302804 A1* 10/2017 Rokuhara .......... H04N 1/00713
2018/0170699 A1    6/2018 Yamasaki
2019/0030920 A1* 1/2019 Mori .................... B65H 3/0669
2020/0254782 A1* 8/2020 Kawai ..................... B65H 7/14

* cited by examiner

RECORDING APPARATUS AND METHOD FOR SUPPRESSING DEVIATION OF RECORDING POSITION OF RECORDING APPARATUS

The present application is based on, and claims priority from JP Application Serial Number 2022-006302, filed Jan. 19, 2022, the disclosure of which is hereby incorporated by reference herein in its entirety.

BACKGROUND

1. Technical Field

The present disclosure relates to a recording apparatus including a recording head that performs recording on a medium such as paper, and a method for suppressing deviation of a recording position in the recording apparatus.

2. Related Art

For example, JP-A-2017-193071 and JP-A-2013-71357 disclose a recording apparatus including a recording head that performs recording on a medium. The recording apparatus includes a medium width detection section that detects a medium width, which is a dimension of a medium transported from a transport source in a width direction intersecting a transport direction of the medium. The medium width detection section detects the medium width from a detection position where both edges of the medium in the width direction are detected. Further, the recording apparatus includes a determination section that determines that the detected medium width coincides or does not coincide with a set medium width. When the determination section determines that the detected medium width does not coincide with the set medium width, the recording apparatus stops a recording operation as an error, for example.

This type of recording apparatus has a cassette or a tray, which sets the medium by a user. The cassette or the tray includes edge guides capable of positioning the set medium in the width direction. The user positions the medium mounted on the cassette or the tray in the width direction by operating the edge guides.

However, the user operates the edge guides to adjust a position of the medium mounted on the cassette or the tray in the width direction, but a gap between the edge guides and the medium may not be adjusted. In addition, when the user forcibly pushes the medium between the edge guides, the medium is mounted between the edge guides in a state in which a width center deviates due to curvature of an end portion thereof. Therefore, the position in the width direction of the medium, which is fed from the cassette or the tray and transported to a recording position corresponding to a recording head, may deviate in the width direction from a set position of a recording system such as the recording head. When the recording head is, for example, a line head, and when the width center of the medium width deviates in the width direction from a width center of the recording head, the recording position where recording is performed on the medium deviates in the width direction. The same problem occurs not only in the configuration in which the recording head is a line head, but also in the configuration in which the recording head is a serial-type recording head.

SUMMARY

According to an aspect of the present disclosure, there is provided a recording apparatus including: a medium mounting section that is configured to mount a medium; a transport section that transports the medium mounted on the medium mounting section; a recording head that performs recording on the medium; a medium detection section that detects at least one of both side edges of the medium transported from the medium mounting section in a width direction intersecting a transport direction of the medium; and a deviation amount acquisition section that acquires a deviation amount of the recording head in the width direction of the medium based on at least one side edge detection position detected by the medium detection section.

According to another aspect of the present disclosure, there is provided a method for suppressing a deviation of a recording position in a recording apparatus, in which the recording apparatus includes a medium mounting section that includes a mounting section body that is configured to mount a medium and a pair of edge guides that guides the medium mounted on the mounting section body to be positioned in a width direction, a transport section that transports the medium mounted on the medium mounting section along a transport passage, and a recording head that performs recording on the medium, and suppresses a deviation in the width direction between the transported medium and the recording position to the medium, the method includes: transporting the medium mounted on the medium mounting section; detecting at least one of both side edges of the medium transported from the medium mounting section in the width direction intersecting the transport passage; acquiring a deviation amount of the medium in the width direction to the recording head based on a detection position of at least one of the detected side edges; and adjusting an assembly position of the edge guide to the mounting section body in the width direction according to the deviation amount.

DESCRIPTION OF EXEMPLARY EMBODIMENTS

First Embodiment

Configuration of Recording Apparatus 11

Figure 1:
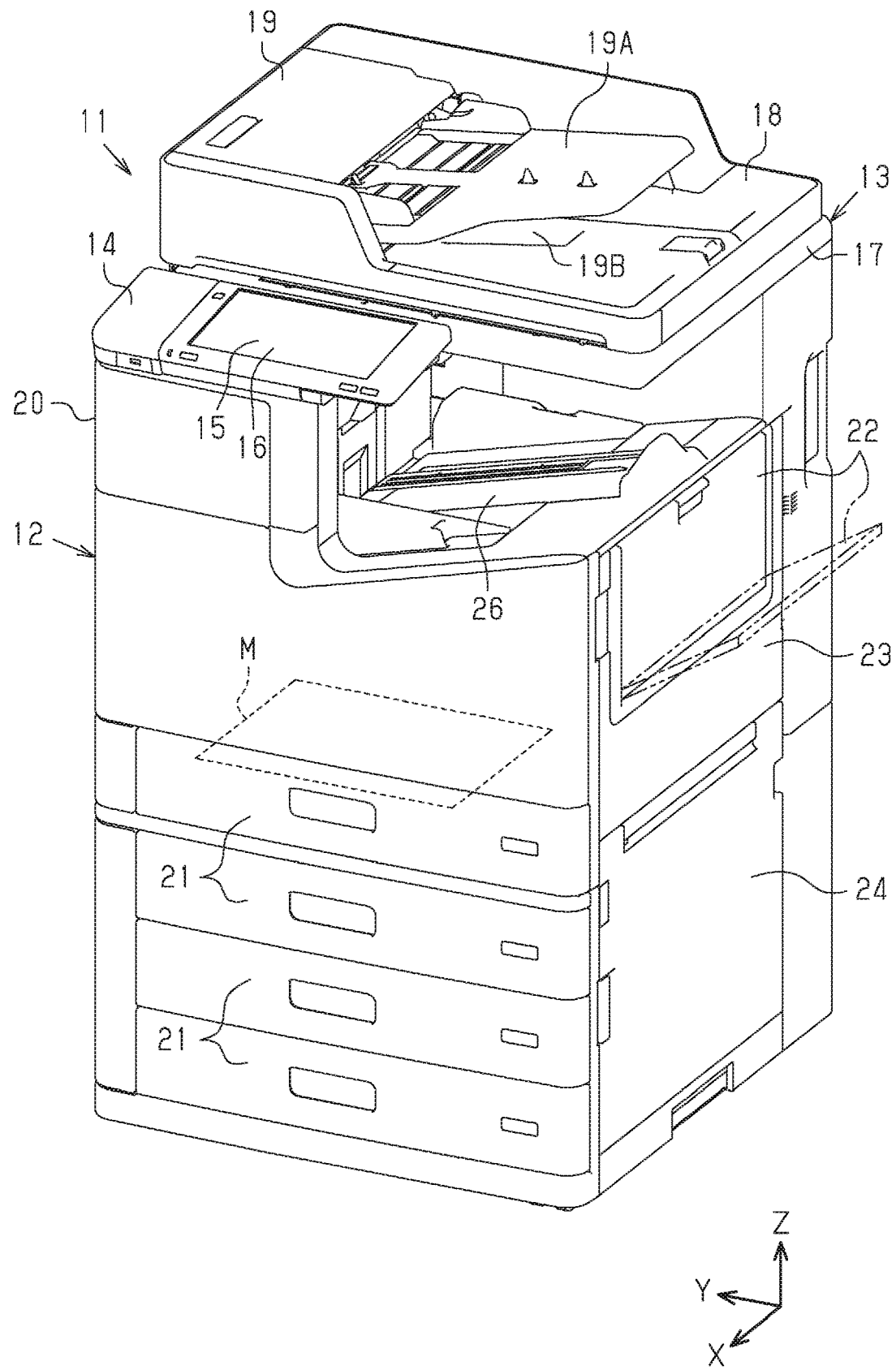
FIG. 1 is a perspective view illustrating a recording apparatus according to a first embodiment.

Hereinafter, an embodiment of a recording apparatus will be described with reference to the drawings. In the drawings, it is assumed that the recording apparatus 11 is placed on a horizontal installation surface. The axis orthogonal to the installation surface of the recording apparatus 11 is a Z-axis, and the two axes orthogonal to the Z-axis are an X-axis and a Y-axis, respectively. In addition, the directions parallel to the X-axis, the Y-axis, and the Z-axis are referred to as an X-axis direction, a Y-axis direction, and a Z-axis direction, respectively. The X-axis direction includes both a +X direction and a -X direction. The Y-axis direction includes both a +Y direction and a -Y direction. The Z-axis direction includes both a +Z direction and a -Z direction. The Z-axis direction parallel to the Z-axis is also referred to as a vertical direction Z. The X-axis direction is also referred to as a width direction X because it is a width direction of a medium M transported by the recording apparatus 11. In addition, the Y-axis is also referred to as a transport direction Y because it is a transport direction of the medium M at a recording position where the recording is performed on the medium M in the recording apparatus 11.

As illustrated in FIG. 1, the recording apparatus 11 is a multifunctional machine including a printer portion 12 having a recording function for recording on the medium M such as paper, and a scanner portion 13 disposed above the printer portion 12. An operation panel 14 is provided on an upper surface portion of the printer portion 12. The operation panel 14 includes, for example, a display section 15 having a touch panel function. A touch panel of the display section 15 may constitute an operation section 16 as an example. The operation section 16 may be an operation switch.

As illustrated in FIG. 1, the scanner portion 13 includes a scanner body portion 17 having an original platen (not illustrated) on an upper surface thereof, and an original platen cover 18 provided on an upper surface of the scanner body portion 17 (original platen glass surface) in an openable/closable manner. An automatic original feeding portion 19 (automatic document feeder (ADF)) is mounted on the original platen cover 18.

The scanner portion 13 has a reading section (not illustrated) that reads an original set on the original platen glass (not illustrated) by opening the original platen cover 18. The automatic original feeding portion 19 sequentially feeds a plurality of originals set on a mounting table 19A one by one, and the original scanned by the reading section is sequentially discharged to a stack section 19B. The recording apparatus 11 includes a substantially rectangular parallelepiped apparatus body 20 having the above-described scanner body portion 17 and the operation panel 14 thereon and the original platen cover 18.

As illustrated in FIG. 1, a plurality of cassettes 21 are inserted into a lower portion of the printer portion 12 so that a plurality of media M can be mounted in a stacked state and accommodated. The cassette 21 can be inserted into and removed from the apparatus body 20 from a front side. In addition, a feeding tray 22 is provided on one side portion of the apparatus body 20 in an openable/closable manner around a lower end thereof. The feeding tray 22 is in an open state indicated by a two-dot chain line in FIG. 1, and the medium M can be mounted (set) thereon. In addition, on one side portion of the apparatus body 20, a maintenance cover 23 including the feeding tray 22 and a maintenance cover 24 disposed below the cover 23 are provided in an openable/closable manner. In the present embodiment, each of the cassette 21 and the feeding tray 22 constitute a medium mounting section as an example. The feeding tray 22 may be a manual feeding tray in which only one sheet of medium M can be set, or may have a configuration having a hopper function in which a plurality of media can be set in a stacked state and automatically fed one by one.

Moreover, a part of the printer portion 12 above the cassette 21 is a recording mechanism portion 25 (see FIG. 2) that performs recording on the medium M fed from the cassette 21 or the feeding tray 22. A stacker section 26 to which the recorded medium M is discharged is provided between the printer portion 12 and the scanner body portion 17 (see FIG. 1).

Internal Configuration of Printer Portion 12

Figure 2:
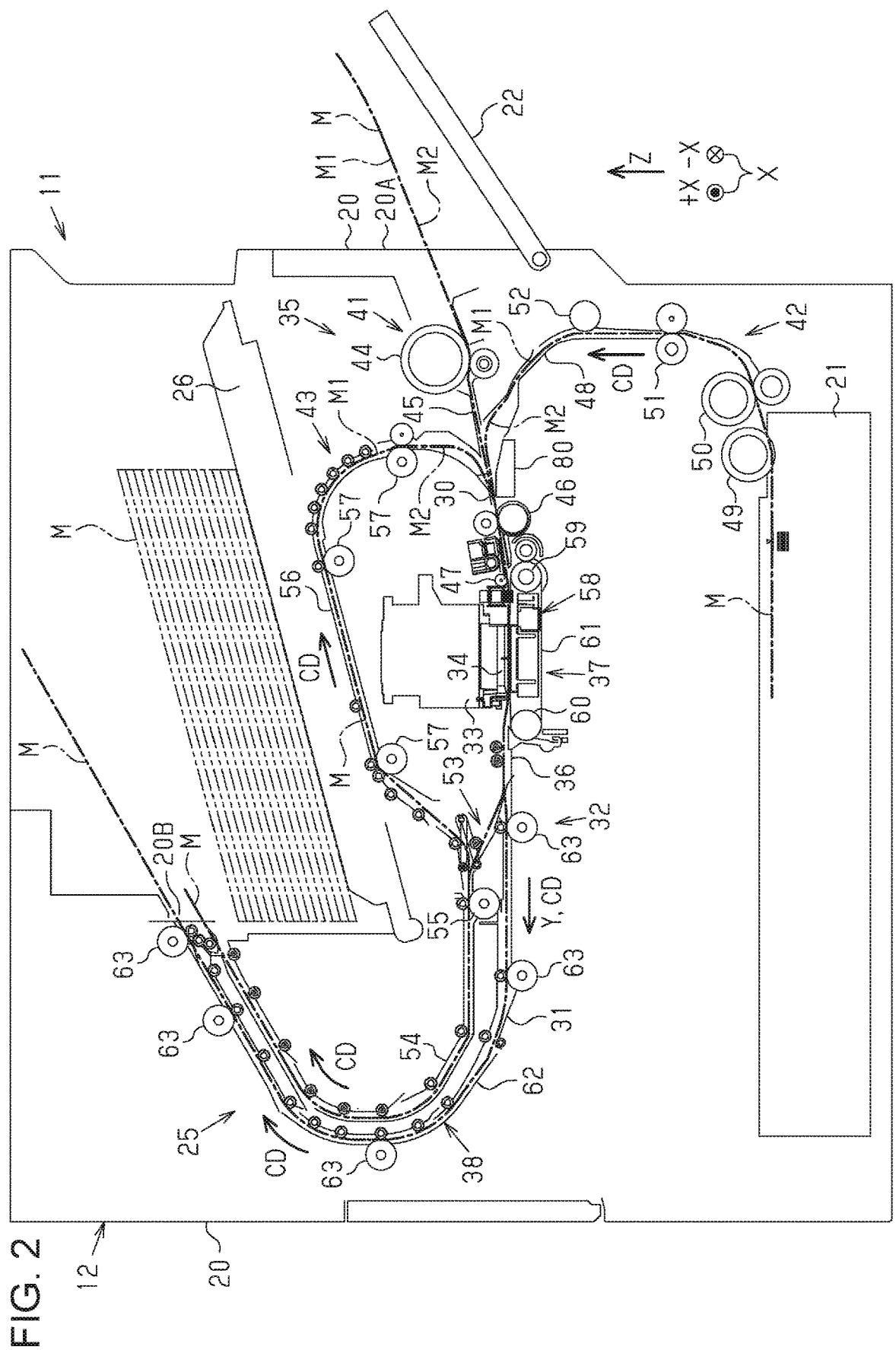
FIG. 2 is a schematic sectional view illustrating an internal configuration of a printer portion of the recording apparatus.

Next, a detailed configuration of the printer portion 12 will be described with reference to FIG. 2. FIG. 2 illustrates only the uppermost cassette 21. In addition, a direction in which the medium M is transported when the medium M is recorded by the recording head 34 is a transport direction Y, and a direction intersecting (particularly, orthogonal to) the transport direction Y is a width direction X.

As illustrated in FIG. 2, the above-described recording mechanism portion 25 is provided inside the apparatus body 20 of the recording apparatus 11 of the present embodiment. The recording mechanism portion 25 includes a transport unit 32 as an example of a transport section that transports the medium M along a transport path 31, and a recording unit 33 having the recording head 34 that performs recording on the medium M in the middle of transport.

The recording head 34 employs an ink jet system that ejects ink. The recording head 34 is formed of an elongated line head extending slightly longer than a maximum width of the medium M in the width direction X orthogonal to a paper surface of FIG. 1, and is a fixed-type line head fixed at a predetermined position so that it cannot move to the width direction X. In the present embodiment, the recording head 34, which is formed of the fixed-type line head, employs a line recording method in which ink droplets are ejected all at once to a range spanning the width direction X of the medium M that is being transported to advance the recording in a line. The ink ejected from the recording head 34 adheres on the medium M, and an image, a document, or the like is recorded on the medium M. The recording unit 33 includes a recording carriage provided so that the recording unit 33 can move in the width direction X, and the recording head 34 provided on the recording carriage can employ a serial recording method that performs recording while moving in the width direction X (main scanning direction). In the serial recording method, a transport operation of the medium M and a recording operation of the recording head 34 are alternately performed.

Moreover, as illustrated in FIG. 2, the transport unit 32 includes a feeding mechanism portion 35 that feeds the medium M, a transport mechanism portion 37 that transports the medium M along a transport path 36 when the recording unit 33 performs recording, and a discharge mechanism portion 38 that transports the recorded medium M along a discharge path 62 and discharges the medium M to the stacker section 26.

The feeding mechanism portion 35 includes a first feeding portion 41 as a feeding source of the feeding tray 22, a second feeding portion 42 as a feeding source of the cassette 21, and a third feeding portion 43 that feeds the medium M, on which recording of a first surface M1 (front surface) has been completed, to the transport path 36 again during double-sided recording. The first feeding portion 41 feeds the medium M, which is set on the feeding tray 22 and whose leading end portion is inserted from an insertion port 20A, to the transport mechanism portion 37 along a first feeding path 45 by rotation of the first feeding roller pair 44.

Moreover, the second feeding portion 42 feeds the medium M from the cassette 21 along a second feeding path 48. The second feeding portion 42 includes a pickup roller 49 that feeds the uppermost medium M in the cassette 21, a separation roller pair 50 that separates the fed medium M into one sheet, and a second feeding roller pair 51 and a driven roller 52 that feed the separated one medium M.

As illustrated in FIG. 2, the transport mechanism portion 37 includes a transport roller pair 46 that is disposed slightly downstream in the transport direction Y from a joining point of the first to third feeding portions 41 to 43, and a belt transport mechanism 58 that is disposed at a position facing the recording head 34. A leading end of the medium M abuts the stopped transport roller pair 46, and thus the medium M is skewed during feeding, and the skewed medium M is transported to the transport path 36 by rotation of the transport roller pair 46.

The belt transport mechanism 58 has a pair of rollers 59 and 60 and an endless transport belt 61 wound around the pair of rollers 59 and 60. In addition, a transport driven roller 47 that is driven in contact with the transport belt 61 is disposed at a position above the roller 59 of the belt transport mechanism 58. The belt transport mechanism 58 employs an electrostatic attraction method that attracts the medium M to a front surface of the charged transport belt 61 by an electrostatic force. The recording head 34 records an image, a document, or the like on the medium M by ejecting ink toward the medium M transported at a constant speed while maintaining a constant gap from the recording head 34 by the belt transport mechanism 58.

The third feeding portion 43 performs re-feeding in which the medium M whose first surface M1 (front surface) as one surface has been recorded is front-back inverted and guided again to the transport mechanism portion 37 during double-sided recording. The medium M whose first surface M1 discharged from the transport mechanism portion 37 has been recorded is guided to a branch transport path 54 by a branch mechanism 53, and guided to a reverse transport path 56 located above the recording unit 33 in FIG. 2 by reverse rotation after normal rotation of the transport roller pair 55. Then, the medium M is fed along the reverse transport path 56 by the rotation of a plurality of reverse transport roller pairs 57, so that the medium M is joined to the first feeding path 45 and the second feeding path 48 in a state in which the second surface M2 is reversed in a direction in which the second surface M2 becomes a recording surface. Thereafter, the medium M is guided again to the transport mechanism portion 37, and the recording head 34 performs recording on the second surface M2 of the medium M, and the double-sided recording is thus performed.

The discharge mechanism portion 38 discharges the medium M on which recording has been completed from a medium discharge port 20B to the stacker section 26 in a direction as indicated by a two-dot chain line in FIG. 2 by rotation of a plurality of discharge roller pairs 63 disposed along the discharge path 62. The discharged and recorded medium M is stacked onto the stacker section 26. A transport passage 30 is used to transport the medium M by a passage from the cassette 21 and the feeding tray 22 through a position where the recording head 34 can perform recording. As illustrated in FIG. 2, the medium M transported from the cassette 21 and the feeding tray 22 is transported in a transport direction CD along the transport passage. Further, a direction in which the medium M is transported in a recording region where the recording head 34 performs recording in the transport direction CD is the transport direction Y parallel to the Y-axis.

As illustrated in FIG. 2, a medium detection device 80 as an example of a medium detection section is disposed upstream in the transport direction Y of the recording head 34. The medium detection device 80 is located below a position in the vicinity of a joining portion of the first feeding path 45 and the second feeding path 48 and a position in the vicinity of a joining portion of the transport passage 30 and the reverse transport path 56. The medium detection device 80 detects a side edge of the medium M in the width direction X intersecting (particularly, orthogonal to) the transport direction Y of the medium M fed by the first feeding portion 41 and the second feeding portion 42.

Figure 10:
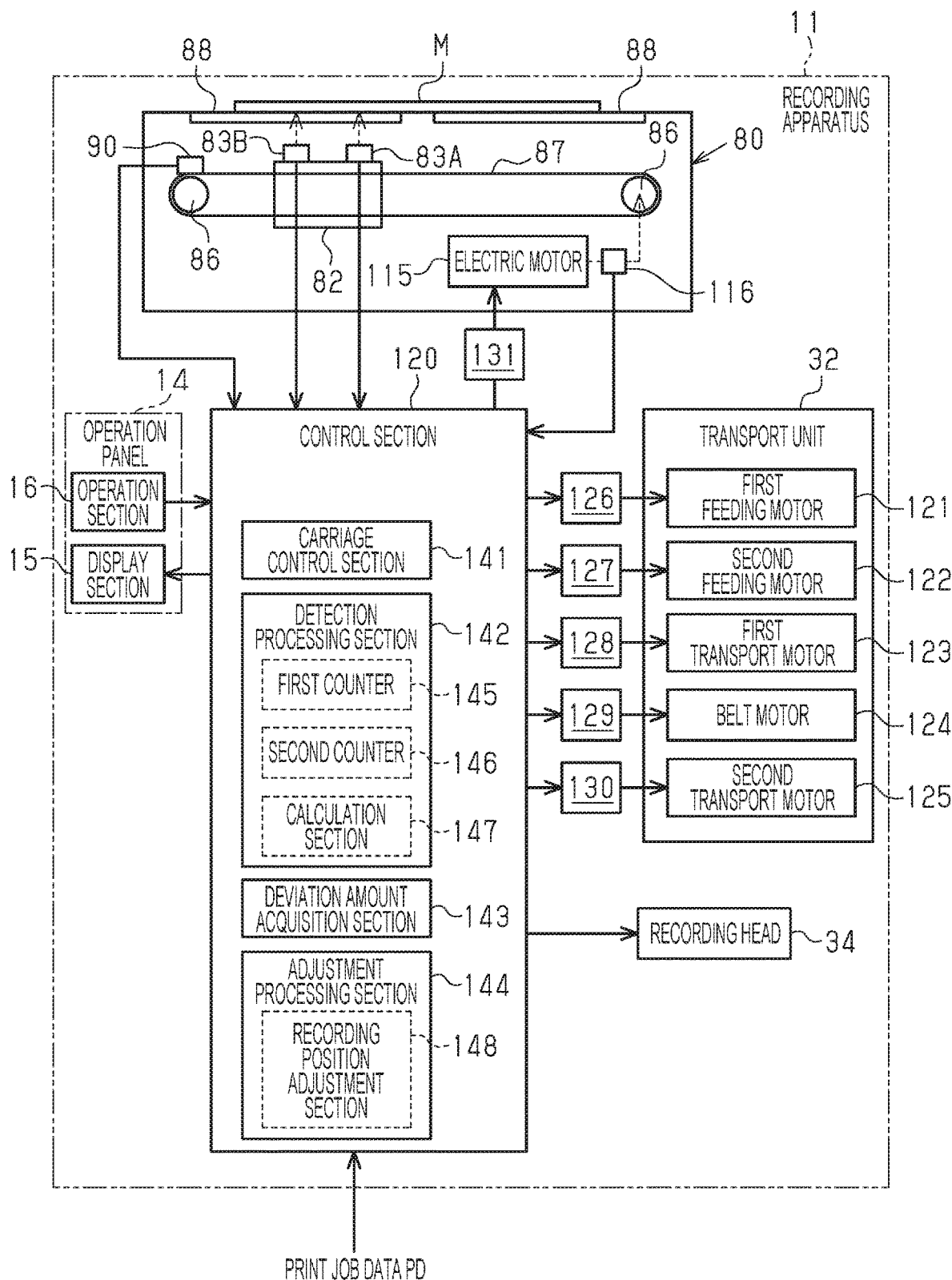
FIG. 10 is a block diagram illustrating an electrical configuration of the recording apparatus.

A driving roller of the first feeding roller pair 44 illustrated in FIG. 2 is driven by power of a first feeding motor 121 (see FIG. 10). In addition, a driving roller of the second feeding roller pair 51 is driven by power of a second feeding motor 122 (see FIG. 10). In addition, a driving roller of the transport roller pair 46 and a driving roller of the reverse transport roller pair 57 are driven by power of a first transport motor 123 (see FIG. 10). The belt transport mechanism 58 illustrated in FIG. 2 is driven by power of the belt motor 124 (see FIG. 10). In addition, the discharge mechanism portion 38 illustrated in FIG. 2 is driven by power of a second transport motor 125 (see FIG. 10).

Description of Cassette 21 and Feeding Tray 22 in Recording Apparatus 11

Figure 3:
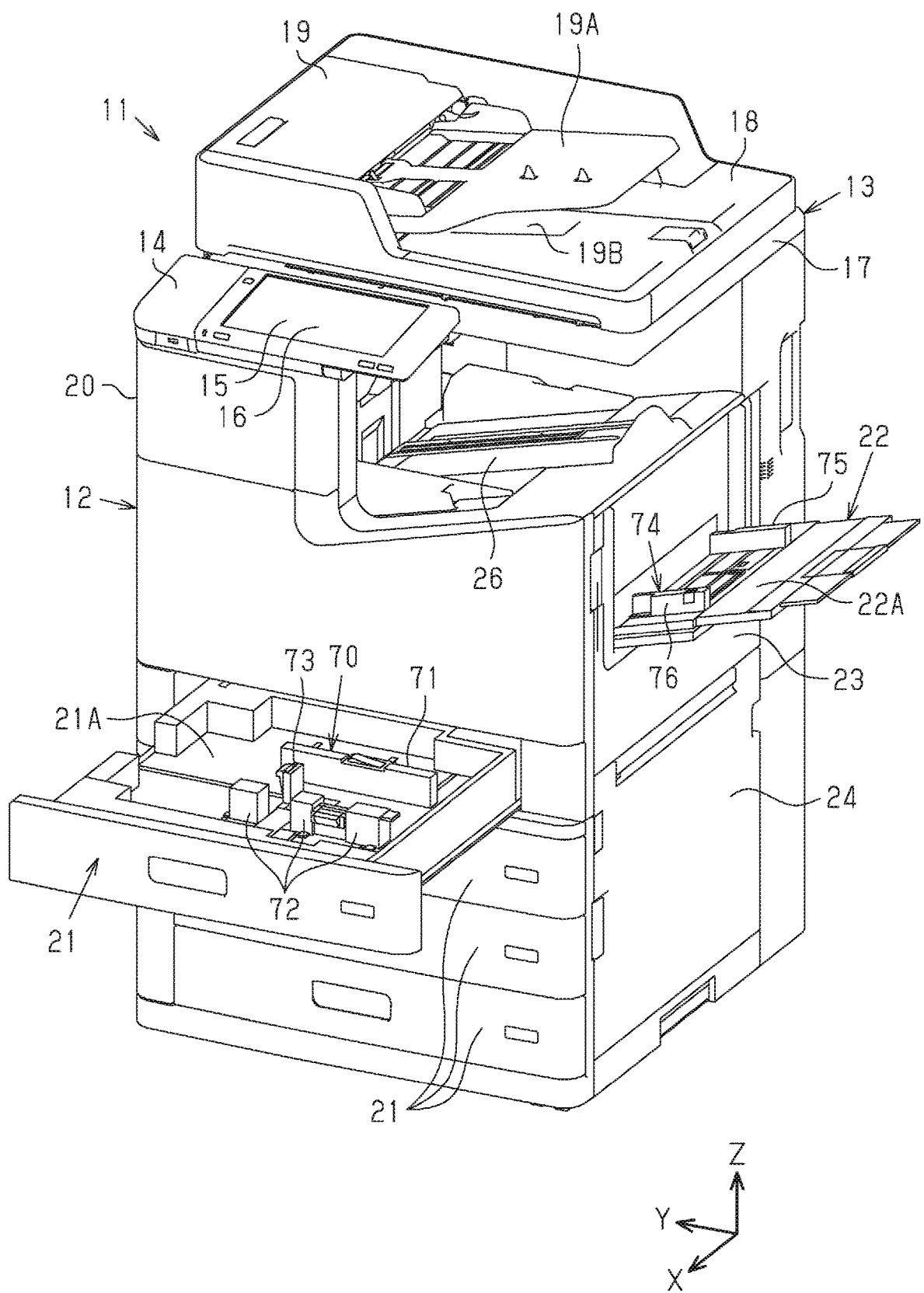
FIG. 3 is a perspective view of a recording apparatus in which a cassette and a feeding tray are open.

As illustrated in FIG. 3, the recording apparatus 11 includes the cassette 21 and the feeding tray 22 as medium mounting sections. FIG. 3 illustrates a state in which the cassette 21 is pulled out from the apparatus body 20 and a state in which the feeding tray 22 is developed for use.

As illustrated in FIG. 3, the cassette 21 has an accommodation recessed portion 21B capable of accommodating the medium M. A first positioning mechanism 70 is attached to the cassette 21. The first positioning mechanism 70 includes a pair of edge guides 71 and 72 capable of determining a mounting position of the medium M in the width direction X. The first edge guide 71 and the second edge guide 72 are located facing each other in the width direction X and slidable to change an interval between them facing each other. In addition, the first positioning mechanism 70 includes a third edge guide 73 that determines the mounting position of the medium M in a direction intersecting the width direction X. The pair of edge guides 71 and 72 determine a position of the medium M accommodated in the accommodation recessed portion 21B in the width direction X.

Moreover, as illustrated in FIG. 3, the feeding tray 22 includes a tray portion 22A capable of mounting the medium M thereon, and a second positioning mechanism 74 attached to the tray portion 22A. The second positioning mechanism 74 includes a pair of edge guides 75 and 76 capable of determining a mounting position of the medium M in the width direction X. The first edge guide 75 and the second edge guide 76 are located facing each other in the width direction X and slidable to change an interval between them facing each other. The pair of edge guides 75 and 76 determine a position of the medium M mounted on the tray portion 22A in the width direction X.

Configurations of Cassette 21 and Adjustment Mechanisms 91 and 101

Next, an internal configuration of the cassette 21 and an adjustment mechanism 91 provided in the cassette 21 will be described with reference to FIGS. 4 and 5.

Figure 4:
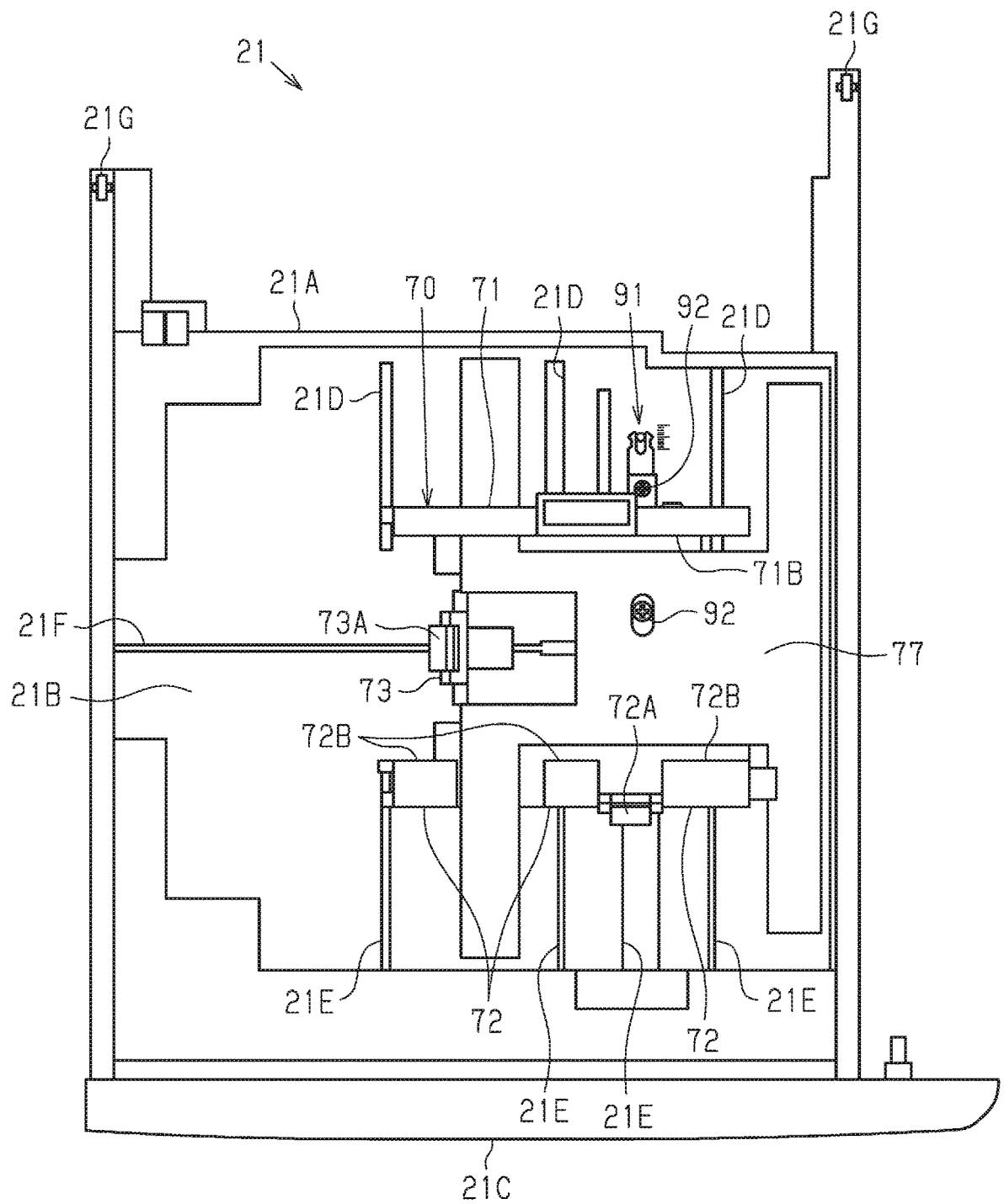
FIG. 4 is a plan view of the cassette.

As illustrated in FIG. 4, the cassette 21 includes a cassette body 21A having the accommodation recessed portion 21B and a cover portion 21C fixed in front of the cassette body 21A. A pair of rollers 21G is provided on a pair of extending portions of the cassette body 21A that extends on a side opposite to the cover portion 21C. The cassette 21 can be attached to and detached from the apparatus body 20 with a light operating force by rolling the pair of rollers 21G.

As illustrated in FIG. 4, the pair of edge guides 71 and 72 constituting a first positioning mechanism 70 is provided slidably in the width direction X in the accommodation recessed portion 21B of the cassette 21. The first edge guide 71 is assembled to be movable in the width direction X along a guide groove 21D provided in a bottom portion of the cassette 21. The second edge guide 72 is assembled to be movable in the width direction X along a guide groove 21E provided in the bottom portion of the cassette 21. The pair of edge guides 71 and 72 can move toward and away from each other in the width direction X by the same amount. The second edge guide 72 has an operation section 72A that allows the user to perform locking and unlocking operations. In addition, the third edge guide 73 is assembled to be movable in the width direction X along a guide groove 21F provided in the bottom portion of the cassette 21. The third edge guide 73 has an operation section 73A that allows the user to perform the locking and unlocking operations. In addition, a hopper plate 77 is provided in a region where the medium M is mounted in the accommodation recessed portion 21B. The hopper plate 77 has, for example, an H shape with recessed portions formed in parts corresponding to the moving regions of the edge guides 71, 72, and 73. When the cassette 21 is inserted into the apparatus body 20, the hopper plate 77 lifts the medium M and presses it against the pickup roller 49 (see FIG. 2).

As illustrated in FIG. 4, the bottom portion of the cassette 21 is provided with the adjustment mechanism 91 capable of adjusting an assembly position of the pair of edge guides 71 and 72 to the cassette body 21A in the width direction X. The adjustment mechanism 91 includes a screw 92 that fixes the assembly position of the first positioning mechanism 70 including the pair of edge guides 71 and 72 so as not to move in the width direction X. By loosening or removing the screw 92, the assembly position of the pair of edge guides 71 and 72 can move in the width direction X for adjustment.

Figure 5:
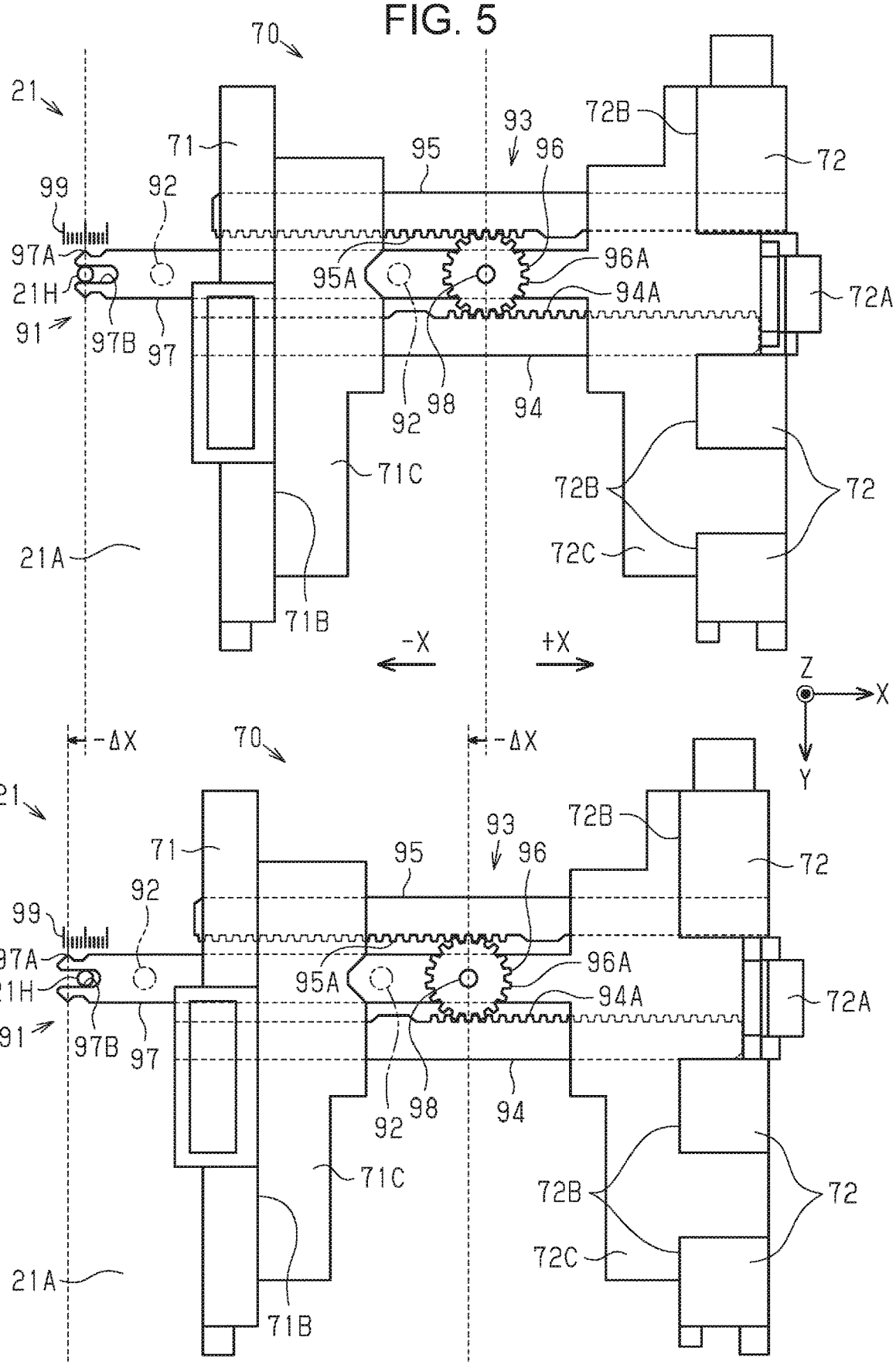
FIG. 5 is a plan view illustrating a first positioning mechanism.

FIG. 5 illustrates a configuration of the first positioning mechanism 70. FIG. 5 illustrates an adjustment method for adjusting the assembly position of the pair of edge guides 71 and 72 in the width direction X by a deviation amount $\Delta x$.

As illustrated in FIG. 5, the first positioning mechanism 70 includes a rack and pinion mechanism 93 that slides the pair of edge guides 71 and 72 in conjunction with each other. The rack and pinion mechanism 93 has a first rack 94, a second rack 95, and a pinion 96.

The first rack 94 is fixed to the bottom portion of the first edge guide 71 and extends in the width direction X toward the second edge guide 72. The second rack 95 is fixed to the bottom portion of the second edge guide 72 and extends in the width direction X toward the first edge guide 71. The first rack 94 and the second rack 95 have teeth 94A and 95A on side surfaces facing each other. The pinion 96 is located at a width center between the first edge guide 71 and the second edge guide 72 in the width direction X, and located between the first rack 94 and the second rack 95 in the transport direction Y. The tooth 96A of the pinion 96 meshes with both the teeth 94A of the first rack 94 and the tooth 95A of the second rack 95.

As illustrated in FIG. 5, the first edge guide 71 has a first guide surface 71B that guides one side edge of the medium M. The second edge guide 72 has a second guide surface 72B that guides the other side edge of the medium M. The first edge guide 71 has a first bottom plate portion 71C extending in the +X direction from a base portion thereof. The second edge guide 72 has a second bottom plate portion 72C extending in the −X direction from a base portion thereof. The pinion 96 is rotatably supported via a shaft portion 98 on an elongated support portion 97 extending in the width direction X from the second bottom plate portion 72C toward the first edge guide 71. In the state illustrated in FIG. 5, the support portion 97 passes through a bottom side of the first edge guide 71 and protrudes from the first edge guide 71 to a side opposite to the second edge guide 72. The support portion 97 constitutes a part of the adjustment mechanism 91 capable of adjusting the assembly position of the first positioning mechanism 70 in the width direction X.

As illustrated in FIG. 5, the adjustment mechanism 91 has a pointer 97A formed at a tip portion of the support portion 97 and a scale 99 formed on a bottom surface of the accommodation recessed portion 21B of the cassette 21. The tip portion of the support portion 97 is movably supported in the width direction X by a guide shaft 21H inserted through a guide groove 97B formed in the tip portion. By loosening two screws 92, the second edge guide 72 can slightly move within a range of the +X direction and the −X direction of the width direction X with respect to the cassette body 21A. The two screws 92 are inserted through oval screw insertion holes elongated in the width direction X formed in a bottom plate portion of the accommodation recessed portion 21B. The screw 92 is fastened to fix the support portion 97 and the bottom plate portion of the accommodation recessed portion 21B. The assembly position of the first positioning mechanism 70 is movable within a longitudinal range of a screw insertion hole (not illustrated) through which the screw 92 is inserted. A range of the scale 99 pointed by the pointer 97A is set according to a movement range of the first positioning mechanism 70. When a person such as a service man operates the adjustment mechanism 91 to perform adjustment work, an adjustment amount when the assembly position of the first positioning mechanism 70 is adjusted can be visually recognized based on a change in a position on the scale 99 pointed by the pointer 97A. The adjustment mechanism 91 that can be manually adjusted in this manner is composed of the pinion 96, the support portion 97, the screw 92, the pointer 97A, the scale 99, and the like.

As illustrated in FIG. 5, it is assumed that the assembly position of the pair of edge guides 71 and 72 deviates in the +X direction from an assembly position of the recording head 34 (see FIG. 2) by a deviation amount $\Delta x$. When the deviation amount $\Delta x$ is adjusted, the two screws 92 are loosened, and the assembly position of the pair of edge guides 71 and 72 and the rack and pinion mechanism 93 are adjusted to the cassette body 21A in the −X direction by the deviation amount $\Delta x$. That is, the assembly position of the first positioning mechanism 70 is adjusted to the cassette body 21A in the −X direction by the deviation amount Δx. In this case, a person adjusts the assembly position of the first positioning mechanism 70 to a position where the pointer 97A moves in the −X direction by an adjustment amount −Δx while looking at the change in the position of the scale 99 pointed by the pointer 97A. When the position adjustment of the first positioning mechanism 70 is completed, the screw 92 is tightened to fix the first positioning mechanism 70 to the cassette body 21A.

Next, an adjustment mechanism 101 provided in the feeding tray 22 will be described with reference to FIG. 6.

Figure 6:
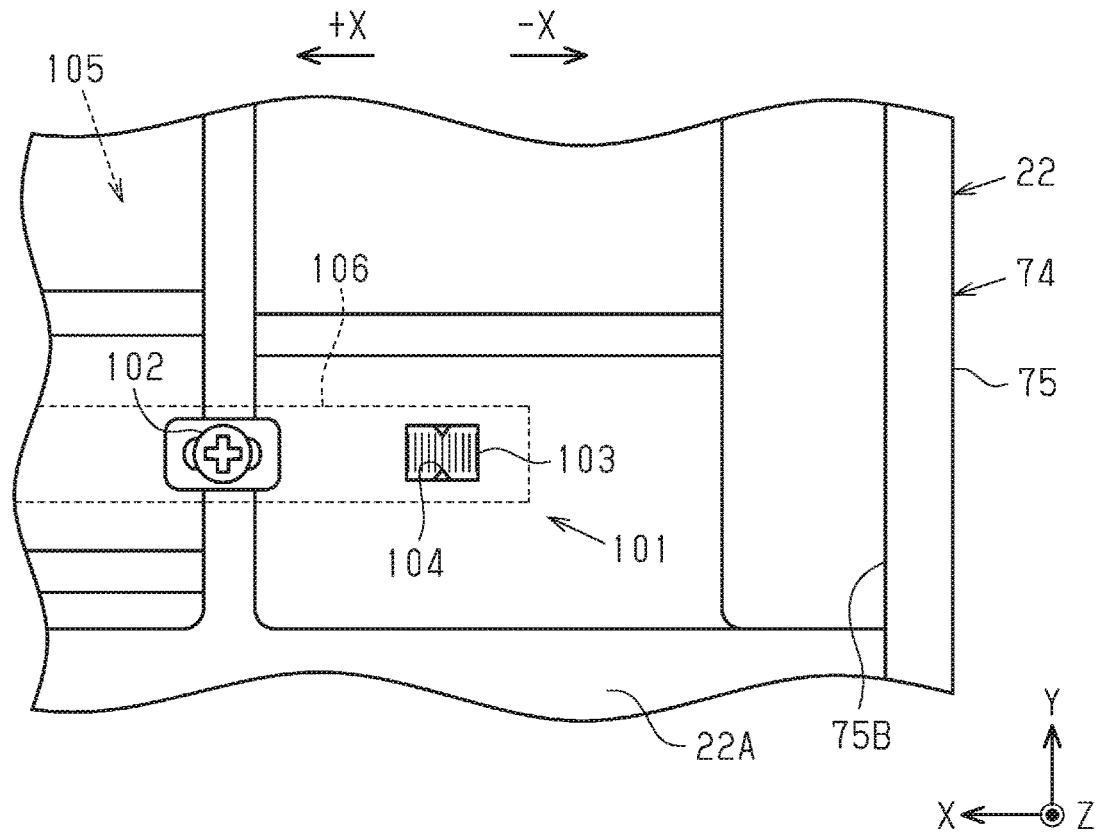
FIG. 6 is a side sectional view illustrating an adjustment mechanism of the feeding tray.

As illustrated in FIG. 6, the feeding tray 22 has the adjustment mechanism 101 having substantially the same configuration as the adjustment mechanism 91 of the cassette 21. The second positioning mechanism 74 has the pair of edge guides 75 and 76 and a rack and pinion mechanism 105. The pair of edge guides 75 and 76 has a guide surface 75B (only one side is illustrated) that guides the medium M.

As illustrated in FIG. 6, the adjustment mechanism 101 includes a screw 102, a support portion 106 forming a rack and pinion mechanism 105, a scale 103 formed at a tip portion of the support portion 106, and a pointer 104 formed on the tray portion 22A. In the example illustrated in FIG. 6, the scale 103 can be visually recognized by a person as it is exposed from a window portion formed in the tray portion 22A. The pointer 104 may be formed on the support portion 106 to be exposed from the window portion of the tray portion 22A, and the scale 103 may be formed on an upper surface of the tray portion 22A.

When a person such as a service man adjusts the deviation amount Δx, the screw 102 of the adjustment mechanism 101 is loosened. Loosening the screw 102 allows the second positioning mechanism 74 to move in the width direction X with respect to the tray portion 22A. That is, the assembly position of the second positioning mechanism 74 can be adjusted in the width direction X. In a state in which the screw 102 loosened, a person positions the second positioning mechanism 74 in the +X direction or the −X direction with respect to the tray portion 22A within a range of the screw insertion hole having a long hole through which the screw 102 is inserted. In this case, the second positioning mechanism 74 is positioned by adjusting a position thereof in the width direction X by the deviation amount Δx based on a change in a position of the scale 103 pointed by the pointer 104. When the position adjustment of the second positioning mechanism 74 is completed, the screw 102 is tightened to fix the second positioning mechanism 74 to the tray portion 22A.

Next, a detailed configuration of the medium detection device 80 will be described with reference to FIGS. 7 and 8.

Figure 7:
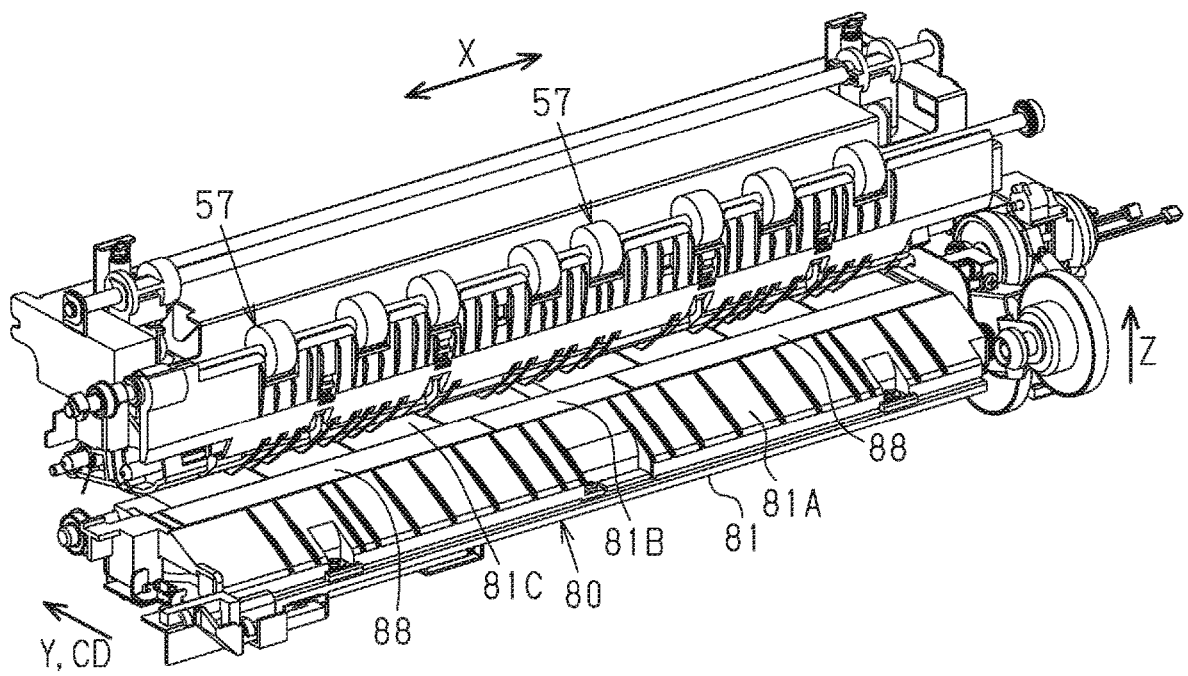
FIG. 7 is a perspective view illustrating a medium detection device and a surrounding part thereof.

As illustrated in FIG. 7, the medium detection device 80 has an elongated shape extending in the width direction X slightly longer than the width of the medium M having the maximum width. Two window portions 88 are provided along the width direction X (longitudinal direction of a housing). In the recording apparatus 11 of the present embodiment, the medium M is center-fed such that the width center of the medium M passes through a width center position of the feeding path regardless of its size. A medium support portion 81B is formed by two window portions 88 and a medium guide portion 81C. In addition, the medium detection device 80 is coupled to wiring from a control section 120, and a detection signal of a sensor 83 is input to the control section 120.

Figure 8:
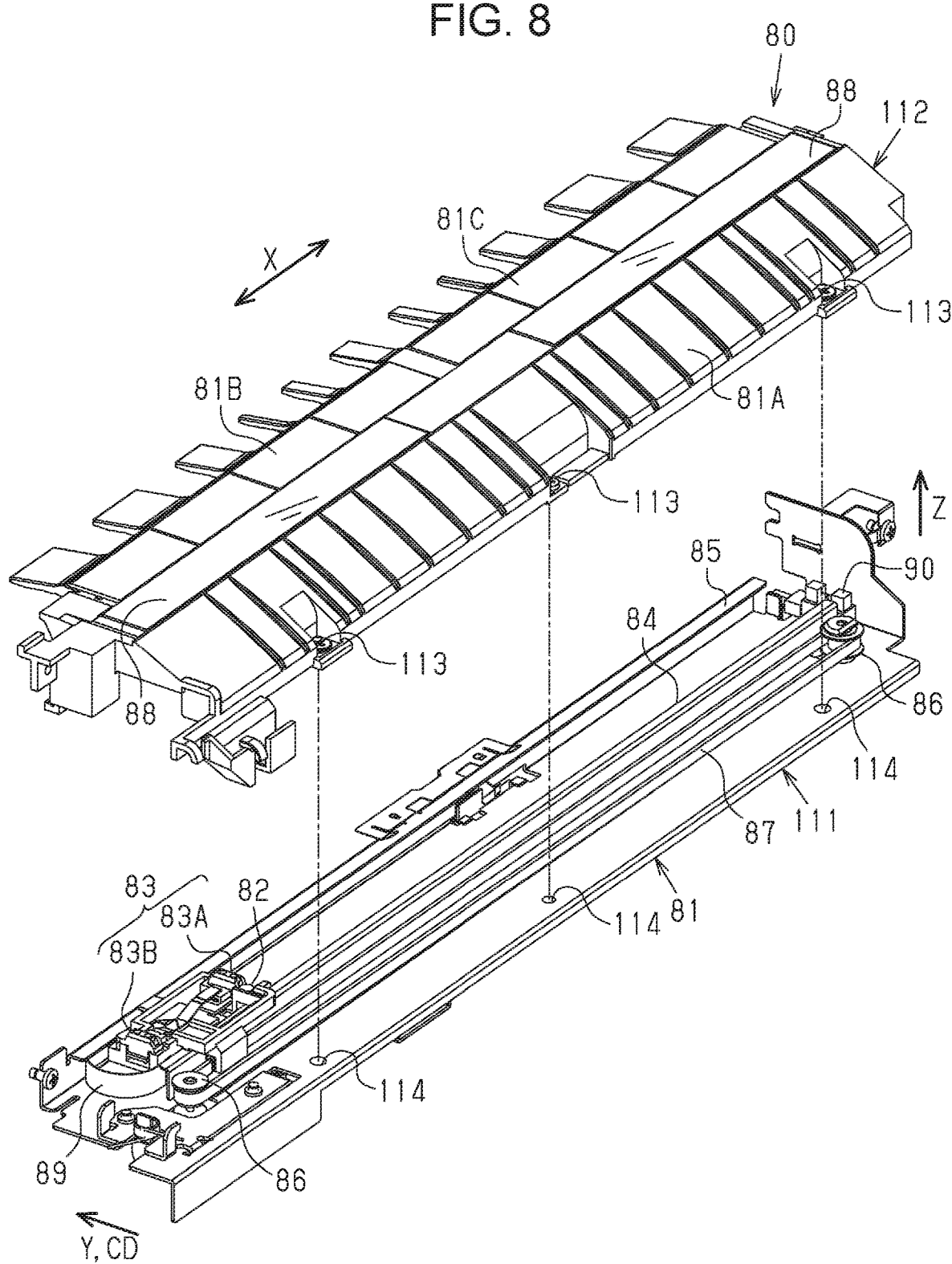
FIG. 8 is an exploded perspective view illustrating the medium detection device.

As illustrated in FIG. 8, on an upper surface of the medium detection device 80, the medium guide portion 81A, the two window portions 88, and the medium guide portion 81C are provided. The medium M fed from the cassette 21 is guided by the medium guide portion 81A. In addition, the medium M fed from the cassette 21 and the medium M fed from the feeding tray 22 are guided along the upper surface of the medium support portion 81B including the window portion 88 and the medium guide portion 81C. The medium M transported along the upper surface of the medium detection device 80 is guided to the transport roller pair 46.

As illustrated in FIG. 8, a housing 81 of the medium detection device 80 includes a base 111 and a cover 112. A pair of rail portions 84 and 85 is provided on an upper surface of the base 111 to extend parallel to each other along a longitudinal direction. A carriage 82 is assembled to be movable in the longitudinal direction of the housing 81 along the pair of rail portions 84 and 85. In addition, on the upper surface of the base 111, a pair of pulleys 86 are assembled to each position on both edge portions thereof in the width direction X with a predetermined interval therebetween. An endless belt 87 is wound around the pair of pulleys 86, and the carriage 82 is fixed to a part of the belt 87. The sensor 83 provided on the carriage 82 includes a pair of sensors 83A and 83B disposed at different positions in the width direction X. In addition, the carriage 82 is coupled to the other end portion of a flexible flat cable 89 whose one end portion is fixed to the base 111. A part of the flexible flat cable 89 extending from a fixed portion to the base 111 is wired along one rail portion 85, an arc-shaped bent portion is formed in the middle of the rail portion, and the other end portion is coupled to the carriage 82. As the carriage 82 moves, the arc-shaped bent portion of the flexible flat cable 89 moves in the width direction X, thereby maintaining electrical coupling between the carriage 82 that is moving and the control section 120. Further, a position sensor 90 is provided on one end portion of the base 111 in the width direction X to detect a home position which is a reference position of the carriage 82 on a movement passage. In the following description, the sensor 83A may be referred to as a first sensor 83A, and the sensor 83B may be referred to as a second sensor 83B.

As illustrated in FIG. 8, the base 111 and the cover 112 are integrally assembled by screwing a plurality of screws 113, which are inserted into the plurality of screw insertion holes formed in a periphery portion of the cover 112, into a plurality of screw holes 114, thereby forming the housing 81.

Positional Relationship Between Recording Head 34 and Medium Detection Device 80

Figure 9:
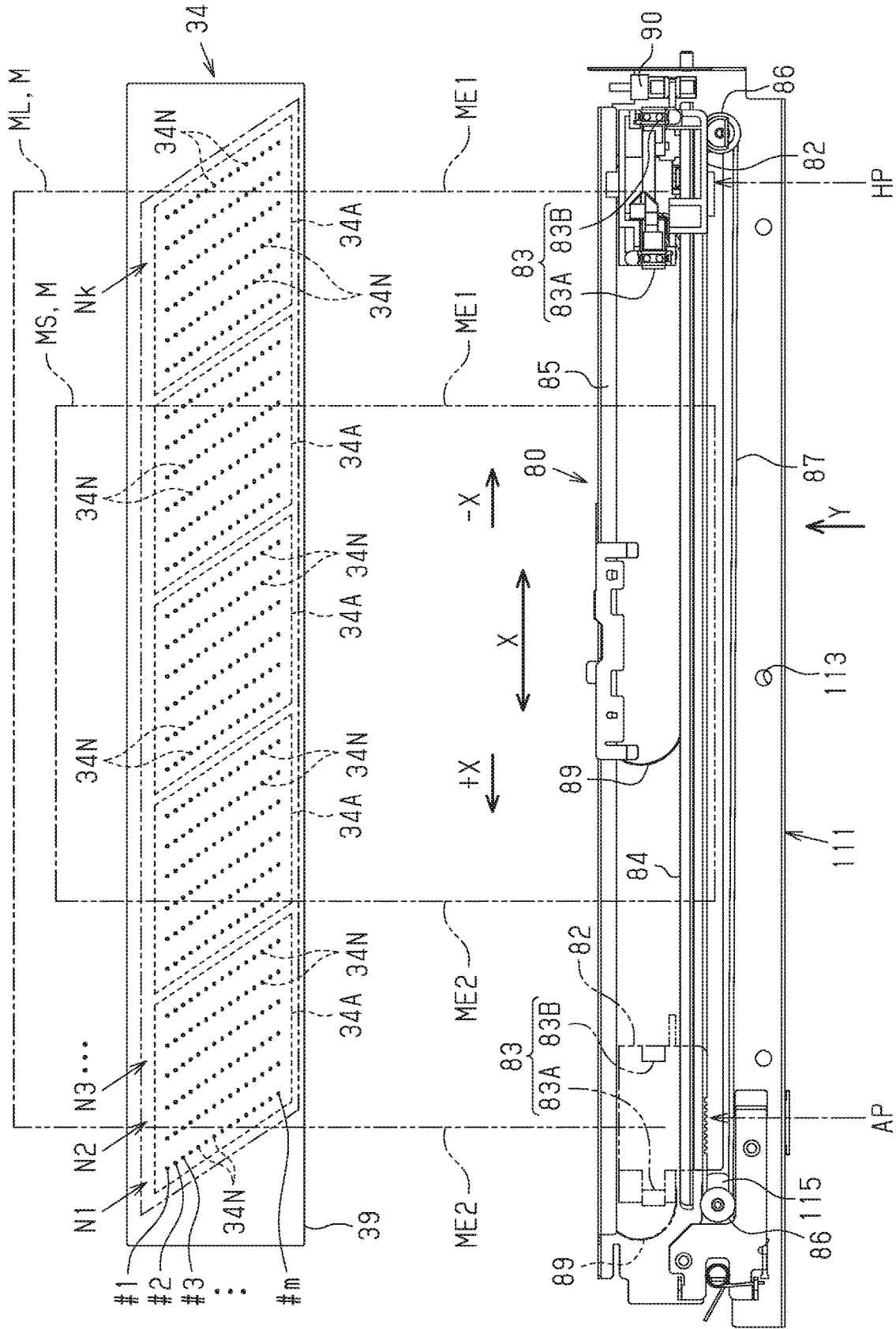
FIG. 9 is a plan view illustrating a recording head and the medium detection device.

FIG. 9 illustrates a positional relationship between the recording head 34, the medium detection device 80, and the medium M. As illustrated in FIG. 9, the carriage 82 moves between a home position HP indicated by a solid line in FIG. 9 and an anti-home position AP indicated by a two-dot chain line in FIG. 9, which is an end portion opposite to the home position HP in the width direction X.

As illustrated in FIG. 9, the home position HP and the anti-home position AP of the carriage 82 are both end positions when the carriage 82 moves in the width direction X. The position sensor 90 is turned on when the carriage 82 is at the home position HP, and turned off when the carriage 82 is away from the home position HP.

As illustrated in FIG. 9, an electric motor 115 is assembled to a back surface of the base 111. A drive shaft of the electric motor 115 is coupled to one pulley 86. The electric motor 115 of this example is, for example, a stepping motor. A control signal is input to the electric motor 115 from the control section 120 through wiring (not illustrated).

The electric motor 115 is driven to rotate normally and reversely based on a control signal (step control signal) from the control section 120, so that the carriage 82 reciprocates in the width direction X along the rail portions 84 and 85 by the normal and reverse rotation of the belt 87.

The two sensors 83A and 83B illustrated in FIG. 9 are light reflective optical sensors. The sensors 83A and 83B each have a light emitting portion and a light receiving portion. When the light receiving portion receives reflected light which is reflected from the light emitted from the light emitting portion, the sensors 83A and 83B output a detection signal of a voltage level corresponding to a light receiving amount. A surface formed of a material having a light reflectance different from a light reflectance of the medium M is disposed at a position facing the movement passages of the two sensors 83A and 83B with the transport passage of the medium M interposed therebetween. The surface is formed by, for example, a partial surface of a guide member (not illustrated) that transports the medium M along the transport passage. Since the medium M normally exhibits a light color such as white, the surface facing the sensors 83A and 83B across the transport passage exhibits a dark color such as black, for example.

Moreover, the position sensor 90 illustrated in FIG. 9 is a light transmissive optical sensor, for example. The position sensor 90 includes, for example, a light emitting portion and a light receiving portion (not illustrated) that are disposed to face each other. When the carriage 82 is at the home position HP, the position sensor 90 is in a detection state because a detected portion 82A (see FIG. 11) protruding from the carriage 82 blocks the light from the light emitting portion to the light receiving portion. On the other hand, when the carriage 82 is away from the home position HP to the anti-home position AP, the position sensor 90 is in a non-detection state because the light receiving portion receives the light projected from the light emitting portion.

As illustrated in FIG. 9, the recording head 34 is a line head and has a plurality of nozzles 34N over a range longer in the width direction X than the maximum paper width. The n nozzles 34N are disposed at a constant nozzle pitch along an oblique direction forming a predetermined acute angle with respect to the transport direction Y, thereby forming a plurality of nozzle rows N1, N2, N3, . . . in the width direction X. In the recording head 34 illustrated in FIG. 9, only two types of nozzles 34N for ejecting ink of two colors among the plurality of types of nozzles 34N for ejecting ink of a plurality of colors are illustrated, and among them, one type of nozzle row is denoted by reference numerals N1, N2, N3, . . . .

The nozzles 34N forming the nozzle rows N1, N2, N3, . . . are numbered as #1, #2, #3, . . . , and #n, for example, in order along a direction from downstream to upstream in the transport direction Y. Pitches between #i and #i+1 (where i=1, 2, . . . , and n−1) in the width direction X are the same. A point group obtained by projecting the nozzles #1 to #n onto a virtual line parallel to the width direction X in the transport direction Y is disposed in the width direction X at a constant pitch. The constant pitch corresponds to a pixel pitch when the recording head 34 performs recording on the medium M. The pitch in the width direction X between the nozzle #n in the nozzle row Nj and the nozzle #1 in the adjacent nozzle row Nj+1 (where j is a natural number) is equal to the pixel pitch. Thus, the nozzles 34N are disposed at a constant pixel pitch in the width direction X over a range wider in the width direction X than the maximum width of the medium M for each color. The recording head 34 is configured by assembling a plurality of unit heads 34A adjacent to each other in the width direction X on a lower surface of a head body 39.

The recording head 34 illustrated in FIG. 9 is assembled at a predetermined position by a frame (not illustrated) forming the apparatus body 20. The recording head 34 is assembled with high positional accuracy so that the width center coincides with a theoretical center HC. Further, the medium detection device 80 is assembled at a predetermined position by the frame (not illustrated) forming the apparatus body 20. The medium detection device 80 is assembled with high positional accuracy so that the width center of a medium detection range coincides with a theoretical center DC.

The recording apparatus 11 can handle a plurality of types of medium size. In FIG. 9, for example, a medium M having the maximum medium width size and a medium M having a small size in which the width size is smaller than the maximum width size are illustrated with a two-dot chain line. In the following description, the medium M having the maximum width size may be referred to as a medium ML, and the medium M having the small size may be referred to as a medium MS.

In this case, the transport roller pair 46 illustrated in FIG. 2 is a registration roller, and determines a timing to start transport of the medium M to a downstream thereof. By abutting the leading end portion of the medium M that has been fed against the transport roller pair 46 that is stopped, a skew removal operation that removes or reduces skew of the medium M is performed. After the skew removal operation, the medium M is carried onto the transport belt 61 of the belt transport mechanism 58 at a constant transport speed by matching a transport speed of the transport roller pair 46 with a feeding speed of the feeding portions 41 and 42.

As illustrated in FIG. 2, the medium detection device 80 detects a side edge in the width direction X of the medium M after the skew removal, at an upstream position in the transport direction Y from a nip position where the transport roller pair 46 nips (holds) the medium M. The medium detection device 80 detects the side edge of the medium M that is stopped after the skew removal or the low-speed medium M that has started to be transported after the skew removal.

As illustrated in FIG. 9, when the medium MS having a smaller width size than the maximum width size, for example, a normal size medium MS is transported, the sensor 83 moves in the width direction X after the skew removal operation to detect side edges ME1 and ME2 of the medium MS. In addition, when the medium ML having the maximum width size is transported, the sensor 83 moves in the width direction X after the skew removal operation to detect the side edges ME1 and ME2 of the medium ML. In the example illustrated in FIG. 9, a side edge of the medium M at the home position HP is referred to as a first side edge ME1, and a side edge of the medium M at the anti-home position AP is referred to as a second side edge ME2. In the present embodiment, the sensor 83 detects the first side edge ME1 and the second side edge ME2, which are both side edges of the medium M in the width direction X.

The control section 120 determines the deviation amount Δx of the transported medium M with respect to the theoretical center HC of the recording head 34, based on positional information on each position of the first side edge ME1 and the second side edge ME2 of the medium M detected by the sensor 83.

Next, an electrical configuration of the recording apparatus 11 will be described with reference to FIG. 10. As illustrated in FIG. 10, the recording apparatus 11 includes the control section 120 that integrally controls the recording apparatus 11, the medium detection device 80, the above-described operation panel 14, the transport unit 32 that transports the medium M, and the recording head 34 that performs recording on the medium M that is being transported. The transport unit 32 includes a first feeding motor 121 as a power source of the first feeding portion 41 that feeds the medium M set on the feeding tray 22, and a second feeding motor 122 as a power source of the second feeding portion 42 that feeds the medium M accommodated in the cassette 21. In addition, the transport unit 32 includes a first transport motor 123 as power sources of the transport roller pair 46 that transports the fed medium M, the discharge mechanism portion 38, and the like, a belt motor 124 as a power source of the belt transport mechanism 58, and a second transport motor 125 as power sources of the transport roller pair 55 that transports the medium M whose first surface M1 is recorded and the reverse transport roller pair 57.

A plurality of motors 121 to 125 are electrically coupled to the control section 120 through the same number of motor drive circuits 126 to 130 as the number of motors in a transport system. The control section 120 controls the respective motors 121 to 125 through the motor drive circuits 126 to 130 to feed, transport, reverse, and discharge the medium M during double-sided recording. Further, the control section 120 performs the skew removal operation of the medium M by controlling the motors 121 to 123 and the like. The control section 120 starts driving the belt motor 124 before the medium M is transported to the transport belt 61, and the medium M, on which the skew has been removed by the skew removal operation, is carried at a constant transport speed onto the transport belt 61 driven at a constant transport speed. An electromagnetic clutch capable of switching the transport roller pair 55 between normal rotation and reverse rotation is provided, and the second transport motor 125 may be discarded by setting the power sources of the transport roller pair 55 and the reverse transport roller pair 57 to the transport roller pair 46 and the common first transport motor 123.

Moreover, the recording head 34 is electrically coupled to the control section 120. For example, the control section 120 controls ejection of the recording head 34 based on print image data in a print job data PD received from a host device (not illustrated). The recording head 34 ejects a liquid such as ink from the nozzles 34N (see FIG. 9) under the ejection control based on the print image data to record an image or the like based on the print image data on the medium M that is being transported. This image or the like is recorded on a part of the medium M that is being transported on the transport belt 61.

Moreover, the control section 120 is electrically coupled to the operation section 16 and the display section 15 that constitute the operation panel 14. Based on an operation signal input from the operation section 16, the control section 120 receives various setting information corresponding to items selected from a menu displayed on the display section 15, and instruction information for instructions of recording, scanning, copying, and the like. Furthermore, the control section 120 has a first mode for detecting the deviation amount Δx in the width direction X of the recording head 34 of the medium M transported to the recording head 34. A person such as a service man operates the operation section 16 to select the first mode when checking the presence or absence of deviation of the medium M and adjusting the deviation amount of the recording head 34 to be small. When the operation signal for selecting the first mode is input from the operation section 16, the control section 120 switches the recording apparatus 11 to the first mode. In addition, the control section 120 causes the display section 15 to display the deviation amount Δx detected in the first mode.

Moreover, the medium detection device 80 is electrically coupled to the control section 120 illustrated in FIG. 10. In detail, the control section 120 is electrically coupled to the electric motor 115 that is the power source of the carriage 82, the position sensor 90, and the first sensor 83A and the second sensor 83B on the carriage 82. The control section 120 drives and controls the electric motor 115 through the motor drive circuit 131 to control the carriage 82 to move forward and backward in the width direction X of the medium M and control the carriage 82 to stop at a target stop position.

Moreover, as illustrated in FIG. 10, the control section 120 determines whether or not the carriage 82 is at the home position HP based on a detection signal SH (see FIGS. 12 and 13) input from the position sensor 90. When the detection signal SH is a signal level (for example, H level) at the time of detection, the control section 120 determines that the carriage 82 is at the home position HP, and when the detection signal SH is a signal level (for example, L level) at the time of non-detection, the control section 120 determines that the carriage 82 is not at the home position HP.

Furthermore, the control section 120 illustrated in FIG. 10 inputs a detection signal SA from the first sensor 83A during movement of the carriage 82, and inputs a detection signal SB (see FIGS. 12 and 13) from the second sensor 83B. The control section 120 acquires detection positions of the side edges ME1 and ME2 (see FIGS. 9 and 11) of the medium M based on the detection signals SA and SB input from the first sensor 83A and the second sensor 83B, respectively. The control section 120 acquires medium information on the detection positions of the side edges ME1 and ME2, a width dimension of the medium M, a medium size, and the like based on the position of the carriage 82, for example, when the side edges ME1 and ME2 of the medium M in the width direction X are detected.

For example, when the service man instructs the recording apparatus 11 to perform a deviation amount measurement process for measuring the deviation amount between the recording head 34 and the width direction X of the transported medium M, the service man operates the operation section 16 to select the first mode. The control section 120 displays a setting screen on the display section 15 when the first mode is selected. On the setting screen, the service man specifies the medium mounting section of the feeding source as a deviation amount measurement target. In this example, either the cassette 21 or the feeding tray 22 can be selected as the medium mounting section. When the service man instructs execution of the first mode on the setting screen in which the medium mounting section is selected, the control section 120 having received the instruction executes a program illustrated in a flowchart of FIG. 14.

The control section 120 illustrated in FIG. 10 includes, for example, a computer and memory (not illustrated). The memory stores a program for medium detection processing illustrated in the flowchart of FIG. 14. The control section 120 includes a plurality of functional sections necessary for the deviation amount measurement process, which function when the computer executes the program. The control section 120 includes a carriage control section 141, a detection processing section 142, a deviation amount acquisition section 143, and an adjustment processing section 144, as the plurality of functional sections. The detection processing section 142 includes a first counter 145, a second counter 146, and a calculation section 147. In addition, the adjustment processing section 144 includes a recording position adjustment section 148.

When the control section 120 receives the instruction of the first mode, the control section 120 executes the deviation amount measurement process. The control section 120 transports the medium M mounted on the specified medium mounting section. When the specified medium mounting section is the cassette 21, the control section 120 drives the second feeding motor 122 and transports the medium M from the cassette 21. The control section 120 performs the skew removal operation when the transported medium M is transported to a predetermined position. The control section 120 removes the skew of the medium M by performing the known skew removal operation such as abutting the leading end of the medium M against the transport roller pair 46 that is stopped. The control section 120 drives the medium detection device 80 to detect the side ends ME1 and ME2 of the medium M at a timing when the skew removal operation is completed. In this case, the carriage control section 141 drives and controls the medium detection device 80.

The carriage control section 141 drives and controls the electric motor 115 through the motor drive circuit 131 to control the carriage 82 to move in the width direction X of the medium M and control the carriage 82 to stop at a target position. The carriage control section 141 causes the sensors 83A and 83B that move in the width direction X together with the carriage 82 to detect the side edges ME1 and ME2 of the medium M.

The detection processing section 142 acquires side end positions PE1 and PE2 of the medium M based on the detection signal SA input from the first sensor 83A and the detection signal SB input from the second sensor 83B. The first counter 145 counts the position of the carriage 82 in the width direction X with the home position HP as the origin. The second counter 146 performs predetermined counting processing in order to detect the side edges ME1 and ME2 based on the detection signals SA and SB, with rising and falling of the signals as a trigger. The calculation section 147 calculates a count value of the first counter 145 when the first sensor 83A detects the side edge, a count value of the first counter 145 when the second sensor 83B detects the side edge, and the detection positions of the side edges ME1 and ME2 (also referred to as side edge detection positions PE1 and PE2) of the medium M using a distance L1 (see FIG. 11) between the sensors 83A and 83B. In this example, the calculation section 147 performs the above calculations, for example, when detecting the side edges ME1 and ME2 of the large-sized medium ML.

Figure 11:
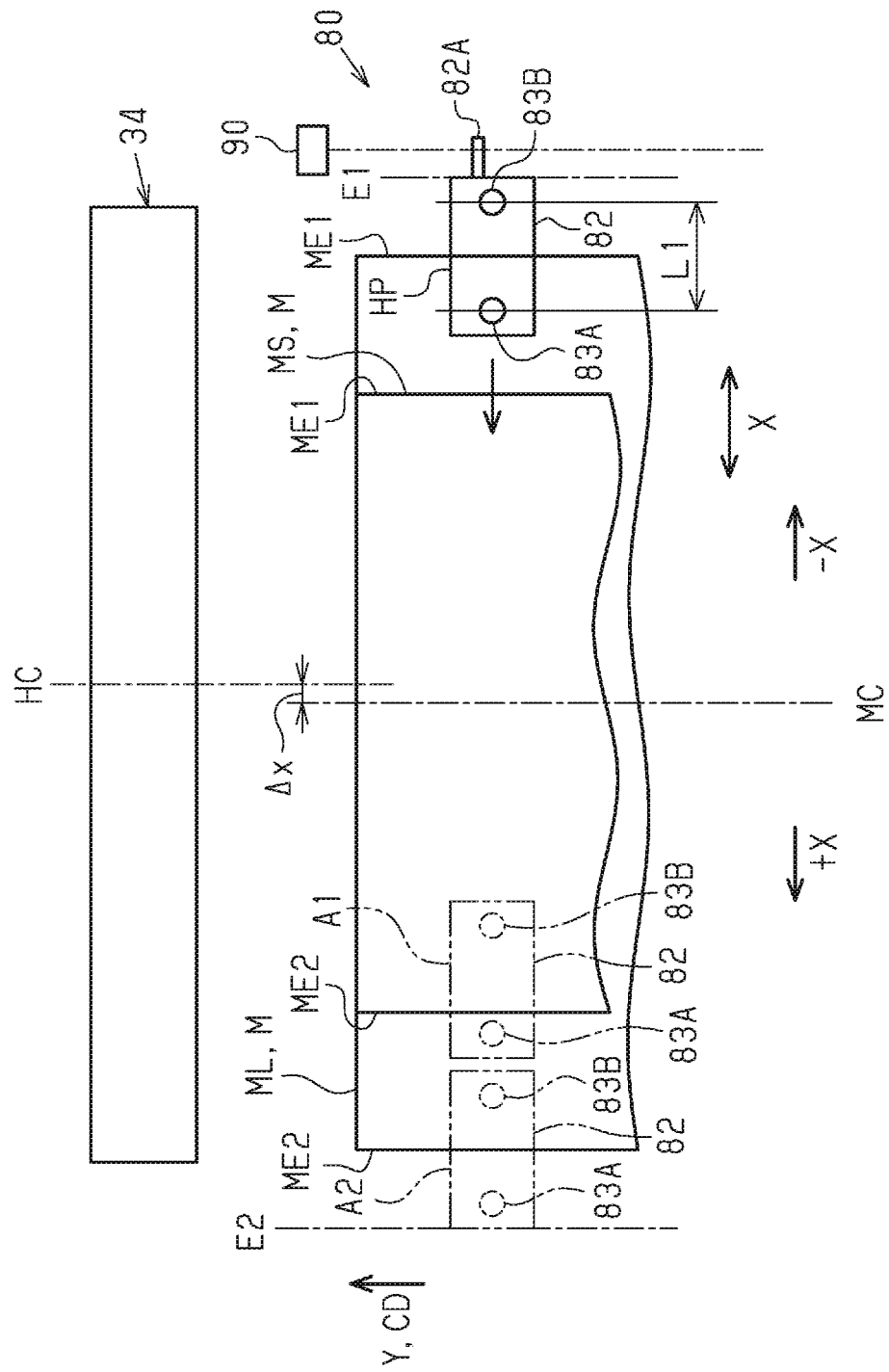
FIG. 11 is a schematic plan view for explaining a medium side edge detection process of the medium detection device.

The deviation amount acquisition section 143 uses the side edge detection positions PE1 and PE2 of the medium M to calculate and acquire the deviation amount $\Delta x$ in the width direction X between the theoretical center HC of the recording head 34 and a width center MC of the transported medium M (see FIG. 11). The control section 120 causes the display section 15 to display the deviation amount $\Delta x$ acquired by the deviation amount acquisition section 143. By displaying the deviation amount $\Delta x$ on the display section 15, a person such as a service man can grasp the deviation amount $\Delta x$ measured by the recording apparatus 11. A person can operate the adjustment mechanism 91 to manually adjust the assembly position of the pair of edge guides 71 and 72 by an appropriate adjustment amount, or can operate the adjustment mechanism 101 to manually adjust the assembly position of the pair of edge guides 75 and 76 by an appropriate adjustment amount.

The adjustment processing section 144 performs adjustment processing to reduce the deviation amount $\Delta x$ in the width direction X between the theoretical center HC of the recording head 34 and the width center MC of the medium M. The recording position adjustment section 148 performs recording position adjustment processing to shift the recording position where the recording head 34 performs recording on the medium M in the width direction X by an adjustment amount corresponding to the deviation amount $\Delta x$. In this case, the adjustment to reduce the deviation amount $\Delta x$ using the adjustment mechanisms 91 and 101 involves manual work, but the recording position adjustment processing is automatically performed by the control section 120, so that the manual work of the person is not required.

Detection of Side Edge of Medium M

FIG. 11 is a schematic diagram explaining a method for detecting the side edges ME1 and ME2 of medium M by the two sensors 83A and 83B. As illustrated in FIG. 11, the first sensor 83A and the second sensor 83B are disposed on the carriage 82 with a center-to-center distance L1 therebetween in the width direction X. The carriage 82 can move within a range between a right edge position E1 (home position HP indicated by a solid line in FIG. 11) and a left edge position E2 (for example, the anti-home position). In this example, in order to keep the size of the recording apparatus 11 in the width direction X short, a movable range of the carriage 82 is relatively narrow to a width dimension of the maximum width medium ML. In the case of the small-sized medium MS, when the carriage 82 is at the end positions E1 and E2, both the sensors 83A and 83B are located outside the medium MS in the width direction to be in a non-detection state in which the medium MS is not detected. Therefore, the side edge detection position can be acquired from the detection signal of either one of the two sensors 83A and 83B. However, in the case of the large-sized medium ML, when the carriage 82 is at the end positions E1 and E2, one of the two sensors 83A and 83B is in a non-detection state, and the other thereof is in a detection state. Moreover, when the carriage 82 is at the end position E1 and the end position E2, a combination of the detection and non-detection states of both sensors 83A and 83B is reversed.

Therefore, as illustrated in FIG. 11, the control section 120 (see FIG. 10) detects the side edges ME1 and ME2 by using only one of the two sensors 83A and 83B (for example, the first sensor 83A) when the small-sized medium MS is used. For example, when only the first sensor 83A is used, the carriage 82 moves from the home position HP illustrated in FIG. 11 to a position A1 indicated by a two-dot chain line in FIG. 11 to detect the two side edges ME1 and ME2 of the small-sized medium MS.

Moreover, when the large-sized medium ML is used, the control section 120 detects the side edges ME1 and ME2 by using both the first and second sensors 83A and 83B. The carriage 82 moves from the home position HP illustrated in FIG. 11 to a position A2 (end position E2) indicated by a two-dot chain line in FIG. 11 to detect the two side edges ME1 and ME2 of the large-sized medium ML. In this case, the second sensor 83B detects the first side edge ME1 of the large-sized medium ML, and the first sensor 83A detects the second side edge ME2 of the large-sized medium ML.

Medium Side Edge Detection Process

Figure 12:
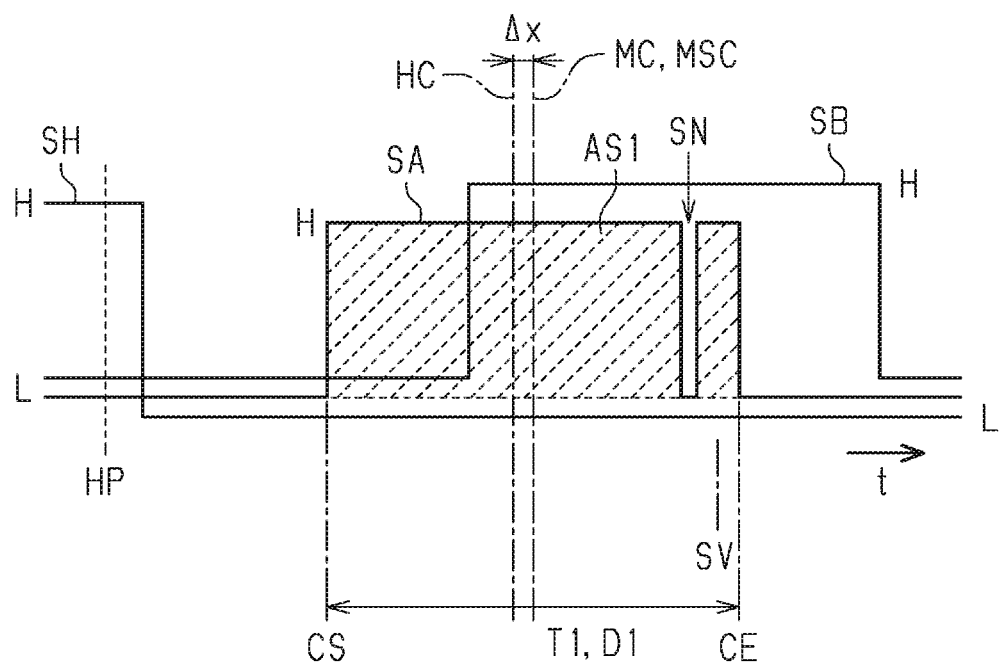
FIG. 12 is a signal waveform diagram of each sensor for explaining a deviation amount acquisition process for a small-sized medium.
Figure 13:
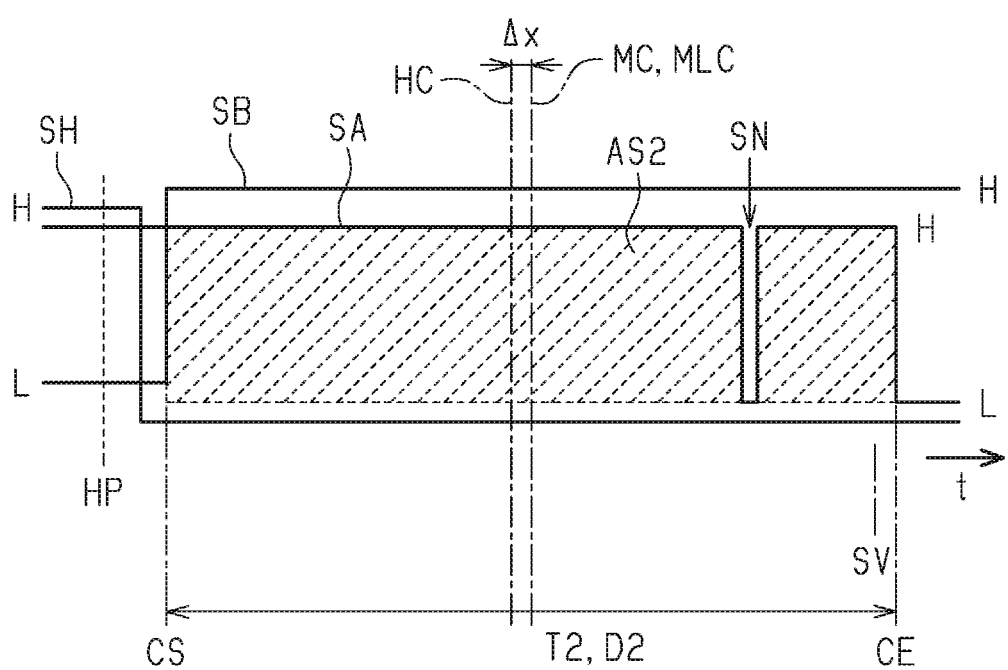
FIG. 13 is a signal waveform diagram of each sensor for explaining a deviation amount acquisition process for a large-sized medium.

FIGS. 12 and 13 illustrate a detection signal output from each of the sensors 83A, 83B, and 90 and illustrate a method for acquiring the deviation amount $\Delta x$ using a detection result of the side edge positions of the medium M. Hereinafter, two methods will be described with reference to FIGS. 12 and 13. The first method is a method for using an area when the detection signal is at the H level, and the second method is a method for using a time or a distance when the detection signal is at the H level.

FIG. 12 illustrates a signal waveform of each detection signal when the side edge of the small-sized medium MS is detected, and FIG. 13 illustrates a signal waveform of each detection signal when the side edge of the large-sized medium ML is detected. In both graphs, a horizontal direction indicates a time t, and a vertical direction indicates voltage levels of the detection signals SA, SB, and SH. Since the carriage 82 moves at a constant speed V1, the time t in both graphs corresponds to the number of steps of the electric motor 115, that is, a moving distance of the carriage 82.

When Small-Sized Medium MS is Used

First, the first method will be described. As illustrated in FIG. 12, when an object to be detected is a small-sized medium MS, when the carriage 82 is at the home position HP, the detection signal SH is at the H level, and the detection signals SA and SB of the both sensors 83A and 83B are at the L level. When the carriage 82 starts moving from the home position HP, the first counter 145 counts the number of pulse edges of the detection signal from an encoder 116 that detects rotation of the electric motor 115. The count value of the first counter 145 indicates a movement position of the carriage 82.

First, as the detected result of the first side edge ME1 by the first sensor 83A, when the detection signal SA rises from the L level to the H level, the count value of the first counter 145 at this time is acquired as the first side edge position PE1. In addition, the second counter 146 starts counting with the side edge detection position at this time as a counting start position CS.

The detection processing section 142 determines whether or not the detection signal SA is at the H level for each position indicated by the count value of the first counter 145, and when the detection signal SA is at the H level, "1" is added to the count value of the second counter 146. The count value corresponds to an area of a region where the detection signal SA is at the H level illustrated in FIG. 12. In this example, a threshold value SV is set to the count value corresponding to the area. The count value of the second counter 146 is counted until the detection signal SA of the first sensor 83A falls from the H level to the L level as a condition that the counting is continued until the count value reaches the threshold value SV.

In FIG. 12, even if the detection signal SA momentarily falls due to noise SN caused by foreign matter such as paper dust, counting continues unless the count value exceeds the threshold value SV. Thus, the threshold value SV functions as a filter that prevents erroneous detection caused by foreign matter such as paper dust.

When the first sensor 83A detects the second side edge ME2 and the detection signal SA falls from the H level to the L level, both counters 145 and 146 stop counting at the position at this time as the counting edge position CE. The count value of the first counter 145 at this time is acquired as the second side edge position PE2. In addition, the count value of the second counter 146, which stops counting at this time, corresponds to a width dimension from the first side edge ME1 to the second side edge ME2 of the medium MS. Thus, the detection processing section 142 illustrated in FIG. 10 acquires the first side edge position PE1 and the second side edge position PE2.

Next, the second method will be explained. In the second method, the second counter 146 counts the time or the distance from a point in time when the sensor 83 moving at a constant speed with the carriage 82 detects the first side edge ME1. As illustrated in FIG. 12, first, when the first sensor 83A detects the first side edge ME1 and the detection signal SA rises from the L level to the H level, the second counter 146 starts counting the time or the distance at the position at this time as the counting start position CS. The second counter 146 counts the number of pulse edges of a clock signal input from a timer (not illustrated) for the time, and counts the number of pulse edges of the detection signal input from the encoder 116 for the distance. The threshold value SV of the time or the distance is set for the count value. The second counter 146 counts the count value until the detection signal SA falls from the H level to the L level on a condition that the counting is continued until the count value reaches the threshold value SV. In FIG. 12, even if the detection signal SA momentarily falls due to noise SN caused by foreign matter such as paper dust, counting continues unless the count value exceeds the threshold value SV. Even with this second method, the threshold value SV functions as a filter that prevents erroneous detection caused by foreign matter such as paper dust.

Thereafter, in a stage in which the count value exceeds the threshold value SV, when the first sensor 83A detects the second side edge ME2 and the detection signal SA falls from the H level to the L level, the first sensor 83A acquires the count value of the first counter 145 as the second side edge position PE2 with the position at this time as the counting edge position CE. The count value of the second counter 146, which stops counting at this time, corresponds to a width dimension of the medium MS. Thus, the detection processing section 142 illustrated in FIG. 10 acquires the first side edge position PE1 and the second side edge position PE2.

When Large-Sized Medium ML is Used

Next, when the object to be detected is the large-sized medium ML, the first method and the second method will be described with reference to FIG. 13. As illustrated in FIG. 13, when the object to be detected is the large-sized medium ML, when the carriage 82 is at the home position HP, the detection signal SH is at the H level, the detection signal SA of the first sensor 83A is at the H level, and the detection signal SB of the second sensor 83B is at the H level. Therefore, the first side edge position PE1 is detected when the detection signal SB rises, and the second side edge position PE2 is detected when the detection signal SA falls. The different detection signals SA and SB are used to acquire the side edge positions PE1 and PE2 in this way. The threshold value SV is set in a similar manner.

As a result that the second sensor 83B detects the first side edge ME1 after the carriage 82 starts moving from the home position HP, when the detection signal SB rises, the count value of the first counter 145 at this time is acquired as the first side edge position PE1. In addition, at this time, the second counter 146 starts counting.

When the detection signal SA is at the H level, the second counter 146 adds "1" to the count value to count the count value corresponding to an area of a region in which the detection signal SA is at the H level from the first side edge position PE1 illustrated in FIG. 13. The second counter 146 counts the count value until the detection signal SA falls on a condition that the counting is continued until the count value reaches the threshold value SV. In FIG. 13, even if the detection signal SA momentarily falls due to noise SN caused by foreign matter such as paper dust, counting continues unless the count value exceeds the threshold value SV. Thus, the threshold value SV functions as a filter that prevents erroneous detection caused by foreign matter such as paper dust.

Then, when the first sensor 83A detects the second side edge ME2 and the detection signal SA falls from the H level to the L level, the count value of the first counter 145 at this time is acquired as the second side edge position PE2. In addition, the count value of the second counter 146, which stops counting at this time, corresponds to the width dimension of the medium MS. Thus, the detection processing section 142 illustrated in FIG. 10 acquires the first side edge position PE1 and the second side edge position PE2 of the large-sized medium ML.

Next, the second method will be explained. As illustrated in FIG. 13, first, when the second sensor 83B detects the first side edge ME1 and the detection signal SB rises from the L level to the H level, the second counter 146 starts counting the time or the distance with the position at this time as the counting start position CS. The second counter 146 counts the count value until the detection signal SA falls from the H level to the L level on a condition that the counting is continued until the count value reaches the threshold value SV. Thereafter, in a stage in which the count value exceeds the threshold value SV, when the detection signal SA of the first sensor 83A falls from the H level to the L level, the first sensor 83A acquires the count value of the first counter 145 as the second side edge position PE2 with the position at this time as the counting edge position CE. In addition, the count value of the second counter 146, which stops counting at this time, corresponds to the width dimension of the large-sized medium ML. Thus, the detection processing section 142 illustrated in FIG. 10 acquires the first side edge position PE1 and the second side edge position PE2 of the large-sized medium ML.

Operation of Embodiment

Next, an operation of the recording apparatus 11 will be described with reference to FIG. 14 and the like.

For example, when a service man adjusts the deviation amount of the medium mounting section, the service man operates the operation section 16 to select the first mode. Then, a setting screen for adjusting the deviation amount is displayed on the display section 15. On the setting screen, the service man operates the operation section 16 to select either the cassette 21 or the feeding tray 22 as the medium mounting section to be adjusted. The medium M is set in the specified medium mounting section. In this case, an example in which the cassette 21 is selected as the medium mounting section will be described. When the medium M is not set in the cassette 21, the service man sets the medium M. After confirming that necessary items have been input on the setting screen, the service man operates the operation section 16 to instruct execution of the deviation amount adjustment process. When an instruction signal is input, the control section 120 executes the deviation amount adjustment process illustrated in FIG. 14.

First, in step S11, the control section 120 transports the medium M. The control section 120 transports the medium M from, for example, the cassette 21 specified as the medium mounting section.

In step S12, the control section 120 detects the side edge of the medium M. The control section 120 drives the medium detection device 80 to detect the side edge of the transported medium M at a position in the middle of the transport passage. Specifically, the detection processing section 142 drives the medium detection device 80. The positions when the sensor 83 detects the side edges ME1 and ME2 of the medium M are acquired as the side edge detection positions PE1 and PE2. The side edge detection positions PE1 and PE2 are detected by a first method or a second method illustrated in FIGS. 12 and 13.

In step S13, the control section 120 acquires the deviation amount $\Delta x$ of the recording head 34 in the width direction X of the medium M based on the side edge detection positions PE1 and PE2. Specifically, the control section 120 acquires a width center position of the medium M from the side edge detection positions PE1 and PE2. The control section 120 acquires the deviation amount $\Delta x$ of the width center position of the medium M with respect to the center HC, which is the theoretical width center of the recording head 34. In this case, assuming that the position of the center HC is xhc and the width center position of the medium M is xmc, the deviation amount acquisition section 143 calculates $\Delta x=xmc-xhc$.

In step S14, the control section 120 displays the deviation amount $\Delta x$. That is, the control section 120 causes the display section 15 to display the deviation amount $\Delta x$ calculated by the deviation amount acquisition section 143.

The service man looks at the deviation amount $\Delta x$ displayed on the display section 15 to adjust the adjustment mechanism 91. Specifically, the service man pulls out the cassette 21 from the apparatus body 20 as illustrated in FIGS. 3 and 4, loosens the screws 92 illustrated in FIGS. 4 and 5, and performs adjustment work for adjusting the assembly position of the first positioning mechanism 70 in the width direction X to the cassette body 21A (particularly, accommodation recessed portion 21B). For the position adjustment, the position is adjusted in the width direction X by the deviation amount $\Delta x$ displayed on the display section 15 while looking at the pointer 97A and the scale 99 illustrated in FIG. 5. After completing the adjustment of the deviation amount $\Delta x$, the screw 92 is tightened. Therefore, the first positioning mechanism 70 is fixed to a position where it is adjusted in the width direction X.

As a result, the position in the width direction X of the medium M positioned in the width direction X by the pair of edge guides 71 and 72 is adjusted. When the adjustment is completed in this way, the medium M is accommodated in the cassette 21 and the cassette 21 is then inserted into the apparatus body 20. During subsequent printing, the deviation amount $\Delta x$ in the width direction X between the recording head 34 and the transported medium M is reduced by the previous adjustment. The recording head 34 can print an image or the like on the medium M without deviation or with extremely small position deviation amount.

On the other hand, even when the feeding tray 22 is selected as the medium mounting section, the deviation amount $\Delta x$ is displayed on the display section 15 by executing the deviation amount adjustment process. The service man loosens the screw 102 illustrated in FIG. 6 and adjusts the assembly position of the second positioning mechanism 74 in the width direction X to the tray portion 22A by the deviation amount $\Delta x$ while looking at the pointer 104 and the scale 103. After the adjustment, the screw 102 is tightened to complete the adjustment work.

As described above, in the deviation amount adjustment process of the first embodiment, the control section 120 measures the deviation amount $\Delta x$ and displays the measured deviation amount $\Delta x$, and the adjustment of the deviation amount $\Delta x$ is performed manually by operating the adjustment mechanisms 91 and 101 by the person.

According to the first embodiment detailed above, the following effects can be obtained.

1. The recording apparatus 11 includes the cassette 21 or the feeding tray 22 that can mount the medium M thereon, the transport unit 32 that transports the medium M mounted on the cassette 21 or the feeding tray 22, and the recording head 34 that performs recording on the medium M. Furthermore, the recording apparatus 11 includes the medium detection device 80 and the deviation amount acquisition section 143. The medium detection device 80 detects at least one of the both side edges ME1 and ME2 in the width direction X intersecting the transport direction CD of the medium M that is transported from the cassette 21 or the feeding tray 22. The deviation amount acquisition section 143 acquires the deviation amount $\Delta x$ of the recording head 34 in the width direction X of the medium M based on at least one of the side edge detection positions PE1 and PE2 detected by the medium detection device 80. According to the configuration, the deviation amount $\Delta x$ in the width direction X between the transported medium M and the recording head 34 can be acquired, such that it is possible to appropriately perform adjustment to reduce the deviation in the width direction X between the medium M and the recording head 34.

2. The recording apparatus 11 includes the display section 15 that displays the deviation amount $\Delta x$. According to the configuration, the user can grasp the deviation amount $\Delta x$ on the display section. It is possible to appropriately perform adjustment to reduce the deviation in the width direction X between the transported medium M and the recording head 34.

3. The cassette 21 or the feeding tray 22 includes the cassette body 21A or the tray portion 22A on which the medium M is mounted, the pair of edge guides 71 and 72 or 75 and 76, and the adjustment mechanisms 91 and 101. The pair of edge guides 71 and 72 or 75 and 76 is assembled to be movable in the width direction X with respect to the cassette body 21A or the tray portion 22A, and guides the medium M to be positioned in the width direction X. The adjustment mechanisms 91 and 101 are configured to adjust the assembly position of the pair of edge guides 71 and 72 or 75 and 76 with respect to the cassette 21 or the feeding tray 22 in the width direction X. According to the configuration, the assembly position of the pair of edge guides in the width direction X is adjusted using the adjustment mechanisms 91 and 101, such that it is possible to reduce the deviation amount $\Delta x$. Therefore, it is possible to reduce the deviation in the width direction X of the recording position where the recording head 34 performs recording on the medium M.

4. In the recording apparatus 11, the adjustment mechanisms 91 and 101 have a motor 151 as a driving source. The control section 120 controls the motor 151 to adjust the assembly position of the edge guides 71 and 72 or 75 and 76 by an adjustment amount corresponding to the deviation amount $\Delta x$. According to the configuration, the adjustment by the adjustment mechanisms 91 and 101 can be automated. Therefore, manual adjustment by a person can be completed less frequently or manual adjustment by a person can be eliminated.

5. The medium detection device 80 includes the sensor 83 that is movable in the width direction X at a position upstream of the nozzles of the recording head 34 in the transport direction CD. When the medium detection device 80 performs the detection operation, the deviation amount acquisition section 143 sets a position when the sensor 83 is switched from the non-detection state to the detection state as a detection position of one side edge. After a first integrated value obtained by integrating the number detected by the sensor 83 from the detection position for each unit position exceeds the threshold value SV set in advance according to a medium size, the sensor 83 sets the position when it is switched from the detection state to the non-detection state as a detection position of the other side edge. According to the configuration, it is possible to detect the two side edge positions of the medium M while suppressing erroneous detection caused by foreign matter such as paper dust. Therefore, erroneous detection of the deviation amount $\Delta x$ can be suppressed.

6. The medium detection device 80 includes the sensor 83 that is movable in the width direction X at a position upstream of the nozzles 34N of the recording head 34 in the transport direction CD. When the medium detection device 80 performs the detection operation, the deviation amount acquisition section 143 sets a position when the sensor 83 is switched from the non-detection state to the detection state as a detection position of one side edge. After a first measurement value obtained by measuring the time or the distance detected by the sensor 83 from the detection position exceeds the threshold value SV set in advance according to the medium size, the sensor 83 sets the position when it is switched from the detection state to the non-detection state as the detection position of the other side edge. According to the configuration, it is possible to detect the two side edge positions of the medium M while suppressing erroneous detection caused by foreign matter such as paper dust. Therefore, erroneous detection of the deviation amount $\Delta x$ can be suppressed.

7. The recording apparatus 11 includes the cassette body 21A or the tray portion 22A that can mount the medium M thereon, the cassette 21 or the feeding tray 22 having the pair of edge guides 71 and 72 or 75 and 76, the transport unit 32, and the recording head 34 that performs recording on the medium M. The pair of edge guides 71 and 72 or 75 and 76 is mounted on the cassette body 21A or the tray portion 22A, and guides the medium M to be positioned in the width direction X. The transport unit 32 transports the medium M mounted on the cassette 21 or the feeding tray 22 along the transport passage 30. A method for suppressing a deviation of a recording position in the recording apparatus 11, which suppresses the deviation in the width direction X between the transport medium M and the recording position of the medium M, includes the following a to d.

a. transporting the medium M mounted on the cassette 21 or the feeding tray 22 (step S11).

b. detecting at least one of both side edges ME1 and ME2 in the width direction X intersecting the transport passage 30 of the medium M transported from the cassette body 21A or the tray portion 22A (step S12).

c. acquiring the deviation amount $\Delta x$ of the medium M in the width direction X with respect to the recording head 34 based on a detection position of at least one of the side edges detected by the sensor 83 (step S13).

d. adjusting the assembly position of the edge guides 71 and 72 or 75 and 76 or the tray portion 22A in the width direction X to the cassette body 21A according to the deviation amount $\Delta x$.

According to the method, the deviation amount $\Delta x$ in the width direction X between the transported medium M and the recording head 34 can be acquired, such that it is possible to appropriately perform adjustment to reduce the deviation in the width direction X between the medium M and the recording head 34.

Second Embodiment

Next, a second embodiment will be described with reference to FIG. 15. In the second embodiment, the configuration of the recording apparatus 11 is the same as in the first embodiment. The details of the deviation amount adjustment process executed by the control section 120 are different from those in the first embodiment. The deviation amount Δx is not manually adjusted by a service man or the like using the adjustment mechanisms 91 and 101, and the control section 120 adjusts the recording position of the recording head 34 in the width direction X. Hereinafter, the deviation amount adjustment process of the second embodiment will be described with reference to FIG. 15.

Figure 15:
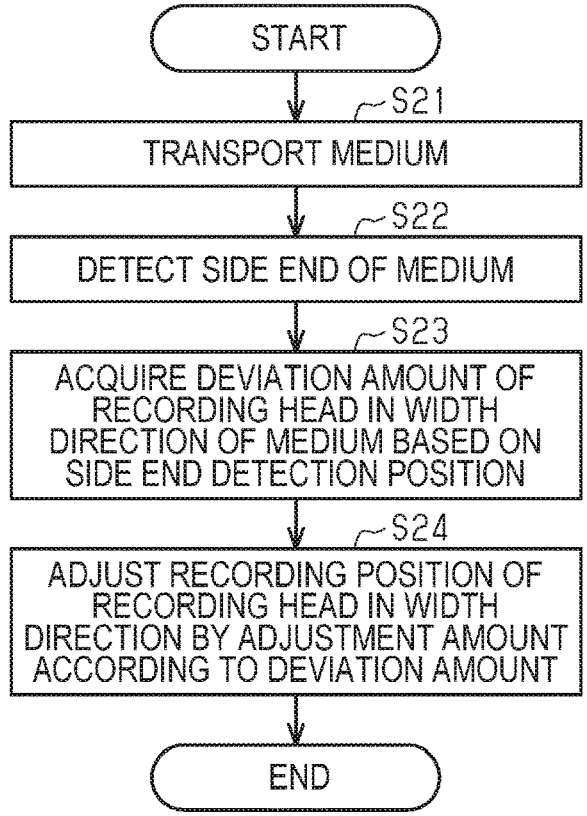
FIG. 15 is a flowchart illustrating a deviation amount acquisition process routine according to a second embodiment.

In FIG. 15, the process of steps S21 to S23 is the same as the process of steps S11 to S13 of the first embodiment.

First, in step S21, the control section 120 transports the medium M. The control section 120 transports the medium M from, for example, the cassette 21 specified as the medium mounting section.

In step S22, the control section 120 detects the side edge of the medium M. The control section 120 causes the medium detection device 80 to detect the side edges ME1 and ME2 of the transported medium M at positions in the middle of the transport passage. Based on the detection signals SA and SB from the medium detection device 80, the detection processing section 142 acquires the detection positions of the side edges ME1 and ME2 (side edge detection positions PE1 and PE2) by the first method or the second method illustrated in FIG. 12 or 13.

In step S23, the control section 120 acquires the deviation amount Δx of the recording head 34 in the width direction X of the medium M based on the side edge detection positions PE1 and PE2. The deviation amount acquisition section 143 of the control section 120 acquires the deviation amount Δx by calculating Δx=xmc−xhc.

In the next step S24, the control section 120 adjusts the recording position of the recording head 34 in the width direction X by an adjustment amount corresponding to the deviation amount Δx. The adjustment processing section 144 illustrated in FIG. 10 performs the adjustment by instructing the recording position adjustment section 148.

The recording position adjustment by the recording position adjustment section 148 is performed as follows. The recording position adjustment section 148 performs a nozzle allocation process for allocating, by the control section 120, each pixel of the print image data included in the print job data PD received from the host device to the nozzles 34N (see FIG. 9) of the recording head 34. The recording position adjustment section 148 executes a nozzle allocation destination adjustment process for allocating the nozzles 34N to be allocated in the nozzle allocation process to the nozzles 34N separated in the width direction X by the adjustment amount corresponding to the deviation amount Δx.

For example, in FIG. 9, by adjusting the nozzle allocation destination from the nozzle #2 to the nozzle #3 in the nozzle row N1, the recording position is adjusted in the −X direction by an amount corresponding to a nozzle pitch in the width direction X. The recording position adjustment section 148 performs such a nozzle allocation destination adjustment process on all pixels of the print image data.

The recording position adjustment section 148 executes the nozzle allocation destination adjustment process for all pixels of the print image data based on the adjustment amount read from the memory. The recording position adjustment section 148 is configured by, for example, an ASIC (not illustrated) included in the control section 120. The control section 120 instructs the ASIC on the adjustment amount necessary for the nozzle allocation process, and the ASIC stores the instructed adjustment amount in the memory. The recording position adjustment section 148, which is a function of the ASIC, performs the nozzle allocation process by correcting the nozzles of the allocation destination where the pixels are allocated to the nozzles at positions deviated in the width direction X by the adjustment amount based on the adjustment amount read from the memory. In step S24, the control section 120 performs a process for writing the adjustment amount corresponding to the deviation amount Δx into the memory of the ASIC.

During the subsequent printing, even if the recording head 34 and the transported medium M deviate in the width direction X by the deviation amount Δx, the recording position where the recording head 34 performs recording on the medium M is adjusted to reduce the deviation amount Δx by the adjustment amount. As a result, the recording head 34 can print an image or the like on the medium M without deviation or with extremely small deviation.

According to the second embodiment, the following effects can be obtained.

8. The recording apparatus 11 includes the control section 120 that adjusts the recording position where the recording head 34 performs recording on the medium M in the width direction X by the adjustment amount corresponding to the deviation amount Δx. According to the configuration, the control section 120 adjusts the recording position where the recording head 34 performs recording on the medium M in the width direction X. Thus, for example, manual work performed by a person using the adjustment mechanisms 91 and 101 can be eliminated or the frequency of manual work can be reduced.

Third Embodiment

Next, a third embodiment will be described with reference to FIG. 16. In the third embodiment, the configuration of the recording apparatus 11 is the same as in the first embodiment. The details of the deviation amount adjustment process executed by the control section 120 are different from those in the first and second embodiments. In the third embodiment, the deviation amount Δx uses both the hardware adjustment in which a person such as a service man manually performs the adjustment using the adjustment mechanisms 91 and 101 and the software adjustment in which the control section 120 adjusts the recording position of the recording head 34 in the width direction X. Hereinafter, the deviation amount adjustment process of the third embodiment will be described with reference to FIG. 16.

Figure 16:
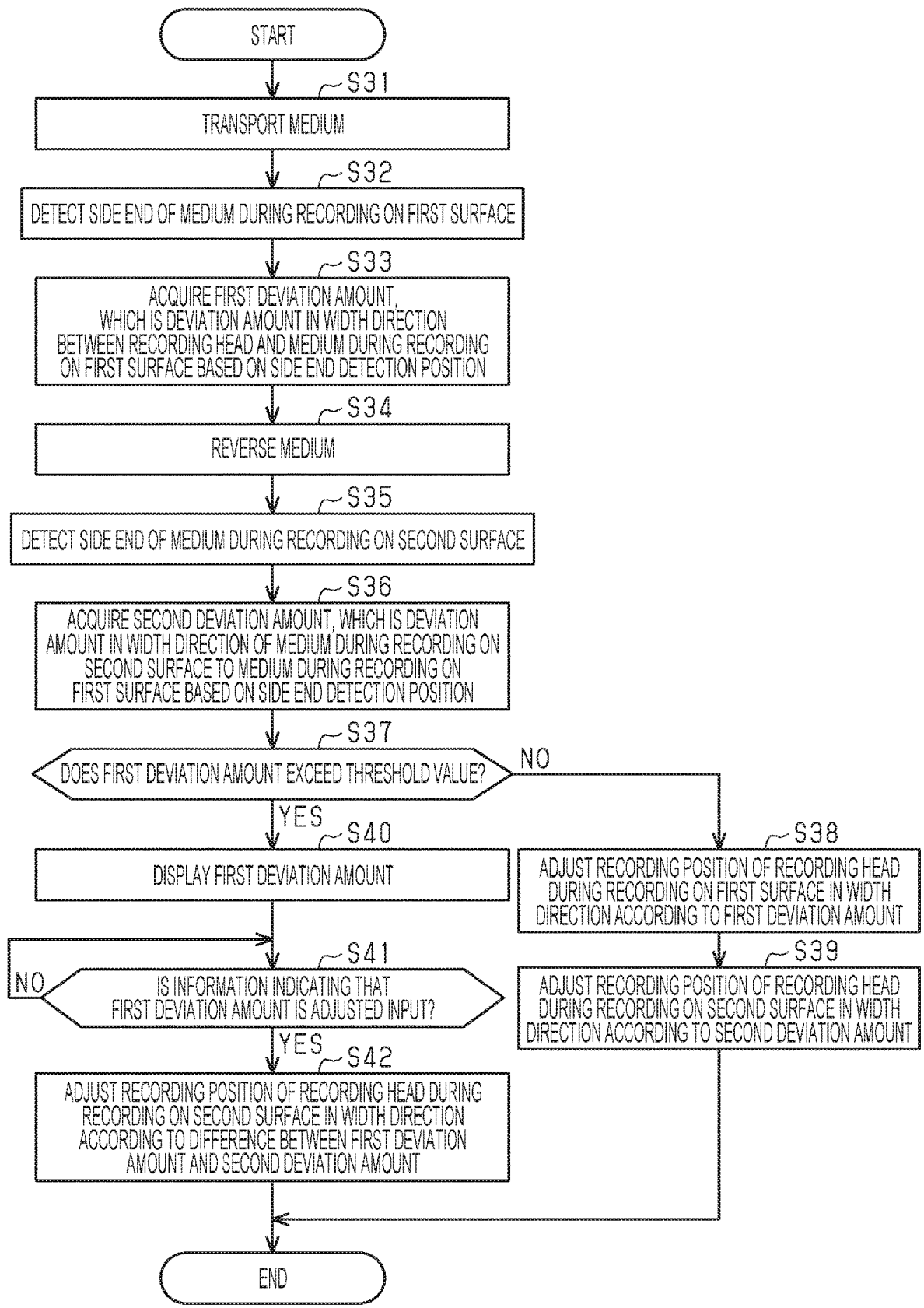
FIG. 16 is a flowchart illustrating a deviation amount acquisition process routine according to a third embodiment.

In FIG. 16, the process of steps S31 to S33 is the same as the process of steps S11 to S13 of the first embodiment.

First, in step S31, the control section 120 transports the medium M. The control section 120 transports the medium M from, for example, the cassette 21 specified as the medium mounting section.

In step S32, the control section 120 detects the side edges ME1 and ME2 of the medium M during recording on the first surface. That is, the control section 120 detects the side edges ME1 and ME2 of the medium M that is transported in a direction in which the first surface M1 becomes the recording surface. Hereinafter, the transport of the medium M performed in a direction in which the first surface M1 becomes the recording surface is referred to as "first transport". The control section 120 causes the medium detection device 80 to detect the side edges ME1 and ME2 of the medium M transported in the direction in which the first surface M1 becomes the recording surface at a position in the middle of the transport passage. Based on the detection signals SA and SB from the medium detection device 80, the detection processing section 142 acquires the detection positions of the side edges ME1 and ME2 (side edge detection positions PE1 and PE2) of the medium M during the first transport by the first method or the second method illustrated in FIG. 12 or 13.

In step S33, the control section 120 acquires a first deviation amount Δx1 which is the deviation amount of the recording head 34 in the width direction X of the medium M based on the side edge detection positions PE1 and PE2. The deviation amount acquisition section 143 acquires the first deviation amount Δx1 by calculating Δx1=xmc−xhc. The first deviation amount Δx1 is the same as the deviation amount Δx in the first and second embodiments.

In the next step S34, the control section 120 reverses the medium M. By controlling the first transport motor 123 and the like, the control section 120 causes the medium M to pass through the reverse transport path 56, thereby reversing the direction in which the second surface M2 becomes the recording surface. By the reverse control, the medium M is guided to the branch transport path 54 by the branch mechanism 53 downstream of the recording head 34, and by the reverse rotation of the transport roller pair 55 after the normal rotation, the medium M passes through the reverse transport path 56, thereby reversing the direction in which the second surface M2 becomes the recording surface. That is, the same reverse operation is performed as that after recording on the first surface M1 is performed when the double-sided recording is performed, the direction in which the second surface M2 becomes the recording surface is reversed.

In step S35, the control section 120 detects the side edges ME1 and ME2 of the medium M during recording on the second surface. That is, the control section 120 detects the side edges ME1 and ME2 of the medium M that is transported in a direction in which the second surface M2 becomes a recording surface. Hereinafter, the transport of the medium M performed in a direction in which the second surface M2 becomes the recording surface is referred to as "second transport". The control section 120 causes the medium detection device 80 to detect the side edges ME1 and ME2 of the medium M transported in the direction in which the second surface M2 becomes the recording surface at a position in the middle of the transport passage. Based on the detection signals SA and SB from the medium detection device 80, the detection processing section 142 acquires the detection positions of the side edges ME1 and ME2 (side edge detection positions PE1 and PE2) during the second transport by the first method or the second method illustrated in FIG. 12 or 13.

In step S36, the control section 120 acquires a second deviation amount Δx2, which is the deviation amount of the recording head 34 in the width direction X of the medium M transported in the direction in which the second surface M2 becomes the recording surface, based on the side edge detection positions PE1 and PE2. The deviation amount acquisition section 143 acquires the second deviation amount Δx2 by calculating Δx2=xmc−xhc. Here, the second deviation amount Δx2 is obtained by adding the deviation amount in the width direction X to the first deviation amount Δx1, in which the deviation amount is generated during transport on the transport path such as the reverse transport path 56 necessary for further reversing.

In step S37, the control section 120 determines whether or not the first deviation amount Δx1 exceeds a threshold value. In this case, for example, the threshold value is set to a limit value of a range that can be adjusted by software adjustment for adjusting the recording position of the recording head 34 by the control section 120. That is, the control section 120 determines whether or not the software adjustment is possible by determining whether or not the first deviation amount Δx1 exceeds the threshold value. When the first deviation amount Δx1 does not exceed the threshold value, the process proceeds to step S38, and when the first deviation amount Δx1 exceeds the threshold value, the process proceeds to step S40. When the software adjustment has been performed in the past, the threshold value is set in consideration of the deviation amount adjusted in the past.

In step S38, the control section 120 adjusts the recording position of the recording head 34 in the width direction X during the recording on the first surface according to the first deviation amount Δx1. The adjustment processing section 144 illustrated in FIG. 10 performs the adjustment by instructing the recording position adjustment section 148. That is, this process is the same as the process of step S24 of the second embodiment. The control section 120 writes the adjustment amount into the memory as a first adjustment amount, in which the adjustment amount is obtained by the recording position adjustment section 148 when the nozzle of the allocation destination where the pixels are allocated in the nozzle allocation process is corrected to the nozzle at the position deviated in the width direction X by the adjustment amount corresponding to the first deviation amount Δx1.

In the next step S39, the control section 120 adjusts the recording position of the recording head 34 in the width direction X during the recording on the second surface according to the second deviation amount Δx2. The adjustment processing section 144 illustrated in FIG. 10 performs the adjustment by instructing the recording position adjustment section 148. This process is basically the same as step S38, although there is a difference in the adjustment amount due to the difference between the first deviation amount Δx1 in step S38 and the second deviation amount Δx2 in step S39. The control section 120 writes the adjustment amount into the memory as a second adjustment amount, in which the adjustment amount is obtained by the recording position adjustment section 148 when the nozzle of the allocation destination where the pixels are allocated in the nozzle allocation process is corrected to the nozzle at the position deviated in the width direction X by the adjustment amount corresponding to the second deviation amount Δx2.

Meanwhile, when the first deviation amount Δx1 exceeds the threshold value, the control section 120 displays the first deviation amount Δx1 in step S40. That is, the control section 120 causes the display section 15 to display the deviation amount Δx calculated by the deviation amount acquisition section 143.

The service man looks at the deviation amount Δx displayed on the display section 15 and adjusts the adjustment mechanism 91. After completing the adjustment of the first deviation amount Δx1, the screw 92 is tightened. As a result, the first positioning mechanism 70 is fixed to a position of the cassette body 21A where it is adjusted in the width direction X.

As a result, the position in the width direction X of the medium M positioned in the width direction X by the pair of edge guides 71 and 72 is adjusted. When the adjustment is completed in this way, the medium M is accommodated in the cassette 21 and the cassette 21 is then inserted into the apparatus body 20. After completing the adjustment in this manner, the service man operates the operation section 16 to input information indicating that the first deviation amount Δx1 has been adjusted to the recording apparatus 11.

In step S41, the control section 120 determines whether or not the information indicating that the first deviation amount Δx1 has been adjusted is input. When the information indicating that the first deviation amount Δx1 has been adjusted is not input, the control section 120 waits until this information is input, and when the information indicating that the first deviation amount Δx1 has been adjusted is input, the process proceeds to step S42.

In step S41, the control section 120 adjusts the recording position of the recording head 34 in the width direction X during the recording on the second surface by an adjustment amount corresponding to the difference between the first deviation amount Δx1 and the second deviation amount Δx2. The adjustment processing section 144 illustrated in FIG. 10 performs the adjustment by instructing the recording position adjustment section 148. In this case, the second deviation amount Δx2 is a deviation amount before the service man manually adjusts the first deviation amount Δx1 using the adjustment mechanisms 91 and 101. Therefore, at a point in time when the adjustment of the first deviation amount Δx1 is completed, the adjustment amount required for the medium M transported in the direction in which the second surface M2 becomes the recording surface is changed from the second deviation amount Δx2 to a value from which the adjustment amount of the first deviation amount Δx1 is subtracted. Therefore, the control section 120 writes the adjustment amount according to the difference between the first deviation amount Δx1 and the second deviation amount Δx2 in the memory read by the recording position adjustment section 148.

Thereafter, when the double-sided printing is performed, even when the recording is performed on the first surface M1 and the recording is performed on the second surface M2, the deviation amounts Δx1 and Δx2 of the recording head 34 and the transported medium M in the width direction X becomes smaller due to the previous adjustment. As a result, images and the like are recorded at appropriate recording positions on both the first surface M1 and the second surface M2. When the feeding tray 22 is selected as the medium mounting section, the same deviation amount adjustment process is executed according to a flowchart illustrated in FIG. 16. Therefore, even when the medium M set on the feeding tray 22 is fed and double-sided printing is performed thereon, images and the like are printed at appropriate recording positions on both the first surface M1 and the second surface M2.

According to the third embodiment, the following effects can be obtained.

9. The recording apparatus 11 includes the reverse transport path 56 for reversing the medium M after the recording is performed on the first surface M1 of the medium M. The medium detection device 80 detects the side edges ME1 and ME2 of the medium M in at least one of the first transport in which the medium M is transported in the direction in which the first surface M1 becomes the recording surface and the second transport in which the medium M is transported in the direction in which the second surface M2, which is a surface opposite to the first surface M1, becomes the recording surface after the medium M is transported through the reverse transport path 56 and reversed. The deviation amount acquisition section 143 acquires the deviation amount Δx in the width direction X between the recording head 34 and the medium M whose side edges ME1 and ME2 are detected by the medium detection device 80.

According to the configuration, the first deviation amount Δx1, which is the deviation amount in the width direction X between the medium M and the recording head 34 when the medium M is transported in the direction in which the first surface M1 becomes the recording surface, and the second deviation amount Δx2, which is the deviation amount in the width direction X between the medium M and the recording head 34 when the medium M is transported in the direction in which the second surface M2 becomes the recording surface, can be acquired. For example, a person can manually adjust at least one of the first deviation amount Δx1 and the second deviation amount Δx2 by operating the adjustment mechanisms 91 and 101, or the control section 120 can adjust the recording position of the recording head 34 in the width direction X.

10. In the method for suppressing a deviation of a recording position, the following is performed. The medium detection device 80 detects the side edges ME1 and ME2 of the medium M transported in the direction in which the first surface M1 becomes the recording surface, and the side edges ME1 and ME2 of the medium M transported in the direction in which the second surface M2 becomes the recording surface. The deviation amount acquisition section 143 acquires the first deviation amount Δx1, which is the deviation amount between the recording head 34 and the medium M transported in the direction in which the first surface M1 becomes the recording surface, and the second deviation amount Δx2, which is the deviation amount between the recording head 34 and the medium M transported in the direction in which the second surface M2 becomes the recording surface. The display section 15 displays the first deviation amount Δx1. The recording apparatus 11 includes the control section 120 that adjusts the recording position of the recording head 34 in the width direction X by the adjustment amount corresponding to the second deviation amount Δx2. According to the method for suppressing a deviation of the recording position, the first deviation amount Δx1, which is the deviation amount in the width direction X between the medium M and the recording head 34 when the medium M is transported in the direction in which the first surface M1 becomes the recording surface, and the second deviation amount Δx2, which is the deviation amount in the width direction X between the medium M and the recording head 34 when the medium M is transported in the direction in which the second surface M2 becomes the recording surface, can be acquired. A person can manually adjust the first deviation amount Δx1 by operating the adjustment mechanisms 91 and 101, and the control section 120 can automatically adjust the second deviation amount Δx2 by adjusting the recording position of the recording head 34 in the width direction X.

The above-described embodiments can be modified as follows.

Figure 17:
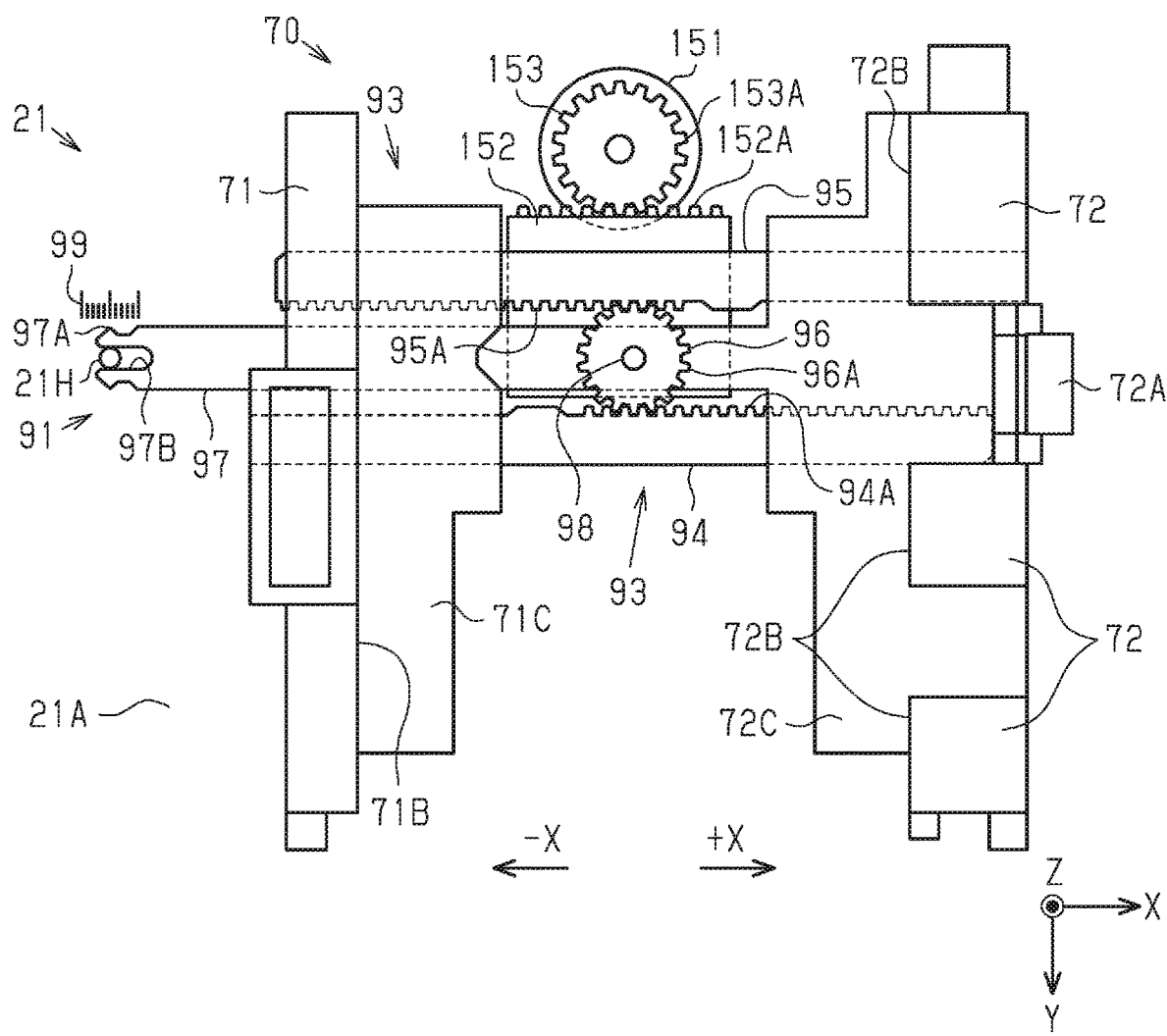
FIG. 17 is a side sectional view illustrating an adjustment mechanism of a feeding tray.

As illustrated in FIG. 17, the adjustment mechanism 91 may be driven by power of a driving source such as the motor 151. As illustrated in FIG. 17, the cassette 21 is provided with a rack member 152 is provided for supporting the pinion 96 and the support portion 97. The rack member 152 meshes with a gear 153 fixed to a rotation shaft of the motor 151 through teeth 152A and 153A. When the control section 120 drives the motor 151 to rotate normally, the first positioning mechanism 70 moves in the +X direction with respect to the cassette body 21A. In addition, when the control section 120 drives the motor 151 to rotate reversely, the first positioning mechanism 70 moves in the −X direction with respect to the cassette body 21A. The control section 120 drives the motor 151 by a drive amount corresponding to the deviation amount Δx in a rotation direction that can reduce the deviation amount Δx acquired by the deviation amount acquisition section 143. As a result, the assembly position of the first positioning mechanism 70 is adjusted to the cassette body 21A so as to reduce the deviation amount Δx.

Figure 14:
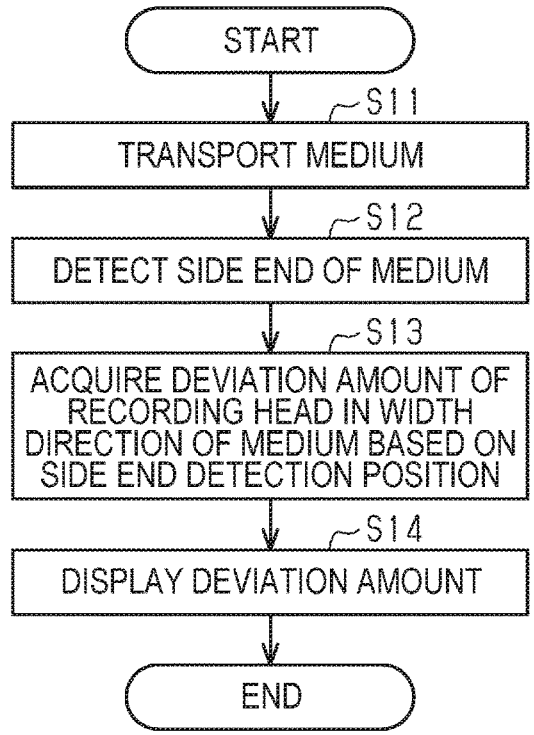
FIG. 14 is a flowchart illustrating a deviation amount acquisition process routine.

When the control section 120 detects that the cassette 21 has been inserted into the apparatus body 20, the control section 120 may execute the deviation amount adjustment process illustrated in FIG. 14. This is because the medium M tends to deviate in the width direction X when the user has an opportunity to operate the edge guides 71 and 72, such as when the medium M in the cassette 21 is replaced with a medium having a different size or type. In particular, it is effective in a configuration in which the control section 120 executes the software adjustment for adjusting the recording position of the recording head 34 in the width direction X according to the deviation amount Δx. The hardware adjustment in which the user manually adjusts the adjustment mechanisms 91 and 101 may be employed.

In the third embodiment, the first deviation amount Δx1 during the first transport in which the medium M is transported in the direction in which the first surface M1 becomes the recording surface is manually adjusted using the adjustment mechanisms 91 and 101, and the second deviation amount Δx2 during the second transport in which the medium M is transported in the direction in which the second surface M2 becomes the recording surface is adjusted by an image process in which the control section 120 changes the recording position. That is, the adjustment is a combination of the hardware adjustment and the software adjustment. In contrast, both the first deviation amount Δx1 during the first transport and the second deviation amount Δx2 during the second transport may be software-adjusted by the control section 120 changing the recording position.

The apparatus body 20 may be provided with an adjustment mechanism capable of adjusting the assembly position of the reverse transport path 56 in the width direction X, and the second deviation amount Δx2 may be manually adjusted by the hardware adjustment using the adjustment mechanism.

The medium detection device 80 only needs to detect one of the side edges ME1 and ME2 of the medium M. In this case, the deviation amount acquisition section 143 of the control section 120 acquires the width dimension of the medium M from size information of the medium M. The deviation amount acquisition section 143 calculates the deviation amount Δx based on the width dimension of the medium M and the detection position of one side edge detected by the medium detection device 80.

In the above-described embodiments, the medium detection device 80 includes two sensors 83A and 83B as an example of a medium detection section, but may be one sensor.

Although the medium detection device 80 is disposed below the transport passage 30, the medium detection device 80 may be disposed above the transport passage 30. With the configuration, the side edge of the medium M can be also detected by reading the medium M downward by the two sensors 83.

The method in which the sensor 83 detects at least one of the side edges ME1 and ME2 of the medium M and uses the detection position of the detected side edge to obtain the deviation amount Δx may be changed as appropriate. For example, the sensor 83 may move in the width direction X from an outside of the medium M in the width direction X, and counting of a position counter may be started from the position where one side edge is detected, to obtain a deviation amount Δx between a count value (measurement position) when the count value reaches a target value corresponding to the center position of the recording head 34 and a theoretical center position (reference position) of the recording head 34. In contrast, without the counting, the deviation amount Δx may be calculated from the result of comparison with the second position information, which is an X coordinate value of the width center based on the theoretical or measurement result of the medium M by adding ½ of the width dimension obtained from the size information of the medium M at that time to the detection position of one side edge.

When the sensor 83 is an optical sensor, it is not limited to a light reflection type, and may be a light transmission type. For example, a light source that can move together with the sensor 83 or a linear light source that can be turned on over a movement range of the sensor 83 is disposed at a position facing the medium detection device 80 across the transport passage. The side edge of the medium may be detected by switching between a light-receiving state in which light from the light source is received and a non-light-receiving state in which light cannot be received due to blocking by the medium M.

The sensor 83 may be replaced with an optical sensor and may be a contact sensor. Even the contact sensor can detect the side edge of the medium.

The power source of the medium detection device 80 may be replaced with a stepping motor and a direct current (DC) motor. The DC motor is provided with, for example, a linear encoder or a rotary encoder capable of outputting a number of pulse signals proportional to a moving distance of the carriage 82, and may be provided with a counter capable of counting pulse edges of the pulse signals output by the encoder to count a value indicating the position of the carriage 82. In addition, the control section 120 may acquire the detection positions of the side edges detected by the sensors 83A and 83B based on the count value of the counter.

As long as a reading position of the medium detection device 80 is upstream of the nozzles 34N of the recording head 34 in the transport direction Y, the medium detection device 80 may be disposed at a position different from that in the above-described embodiment. Further, the reading position of the medium detection device 80 may be downstream of the nozzles 34N of the recording head 34 in the transport direction Y. For example, when the first mode for maintenance by the service man is set and the medium M is transported without recording, the side edge of the medium M can be detected even if the reading position is downstream of the nozzles 34N in the transport direction CD.

The recording apparatus 11 may be a serial printer. When the recording apparatus 11 is a serial printer, a maximum recording range that is assumed by the recording head configured to be movable with the carriage is set. When a width center position in the recording range is a center position, the deviation amount can be acquired by performing the detection process and the calculation process in the same manner as in the line printer.

A sensor constituting an example of the medium detection section may be provided in the carriage of the serial printer. That is, the serial printer is configured so that the carriage having the recording head 34 can move in the main scanning direction. The carriage is equipped with a sensor capable of detecting the side edge of the medium. A deviation amount between the center position of the recording range of the serial-type recording head 34 and the width center of the medium may be acquired based on the detection position of the side edge of the medium by the sensor. Then, the user may be notified of the acquired deviation amount by displaying it on the display section.

The medium mounting section of the recording apparatus 11 may be only one of the cassette 21 and the feeding tray 22. Further, the number of cassettes 21 is not limited to plural, and may be one. Further, the number of feeding trays is not limited to one, and a plurality of feeding trays may be provided. The medium position deviation amount of at least one of the plurality of cassettes or the medium position deviation amount of at least one of the plurality of trays may be acquired, and the acquired position deviation amount may be notified by a method such as displaying the acquired position deviation amount on the display section, which is an example of a notification section.

The medium detection section is not limited to a configuration in which the sensor is movable, and may have a configuration in which the sensor is fixed. For example, the fixed-type medium detection section includes a plurality of sensors continuously or intermittently along the width direction in regions corresponding to the side edges of the medium M. The fixed-type medium detection section includes a light source at a position facing the plurality of sensors across the transport passage. When the medium M blocks the light from the light source, the side edge of the medium M is detected by switching the sensor that no longer receives the light from turn-on to turn-off. The control section acquires the detection position of the side edge from the position of the sensor that has detected the side edge of the medium M.

The position for detecting at least one side edge of the transported medium M may be downstream in the transport direction CD from the recording position of the recording head. For example, at least one side edge of the medium M may be detected by a sensor disposed downstream of the recording position. In this case, at least one side edge of a part of the medium M before recording may be detected, or at least one side edge of a part of the medium M after recording may be detected.

Only one side edge of the transported medium M may be detected. In this case, the deviation amount acquisition section 143 of the control section 120 may use a detection position of one side edge and the width dimension acquired from the medium size information included in the print job data PD to calculate the deviation amount Δx.

The present disclosure is not limited to a center feeding method in which the medium M is fed to the position in the width direction X where the width center of the medium transport region and the width center of the medium M match. A one-sided feeding method may be used in which the medium M is shifted to one side in the width direction X so that one side edge of the medium M in the width direction matches one side edge of the medium transport region in the width direction.

The recording apparatus 11 is not limited to a line printing type recording apparatus (line printer) or a serial printing type recording apparatus (serial printer), and may be a lateral printing type recording apparatus (lateral printer) capable of moving the carriage in two directions of the main scanning direction and the sub-scanning direction. Even when applied to this type of serial printer or lateral printer, it is possible to acquire the deviation amount between the transported medium M and the recording position of the recording head.

Each functional section built in the control section 120 is not limited to being implemented by software using a computer that executes a program, and may be implemented by hardware using an electronic circuit such as field-programmable gate array (FPGA) or application specific IC (ASIC) or may be implemented in cooperation with software and hardware.

The medium M is not limited to paper, and may be a resin film or sheet, a resin-metal composite film (laminate film), a woven fabric, a nonwoven fabric, a metal foil, a metal film, a ceramic sheet, or the like.

The recording apparatus 11 is not limited to a multifunctional machine, and may be a printer having a printer portion without a scanner portion.

The recording apparatus 11 is not limited to an ink jet printer, and may be a dot impact printer, a thermal transfer printer, or an electrophotographic printer.

Hereinafter, technical concepts understood from the above-described embodiments and modification examples will be described together with an operation and effect thereof.

A. A recording apparatus includes: a medium mounting section that can mount a medium; a transport section that transports the medium mounted on the medium mounting section; a recording head that performs recording on the medium; a medium detection section that detects at least one of both side edges of the medium transported from the medium mounting section in a width direction intersecting a transport direction of the medium; and a deviation amount acquisition section that acquires a deviation amount of the recording head in the width direction of the medium based on at least one side edge detection position detected by the medium detection section.

According to the configuration, the deviation amount in the width direction between the transported medium and the recording head can be acquired, such that it is possible to appropriately perform adjustment to reduce the deviation in the width direction between the medium and the recording head.

B. The recording apparatus may further include a reverse transport path that reverses the medium after the recording is performed on a first surface of the medium, in which the medium detection section may detect the side edge of the medium in at least one of a first transport in which the medium is transported in a direction in which the first surface becomes a recording surface and a second transport in which the medium is transported in a direction in which a second surface, which is a surface opposite to the first surface, becomes the recording surface after the medium is transported through the reverse transport path and reversed, and the deviation amount acquisition section may acquire the deviation amount in the width direction between the recording head and the medium whose side edge is detected by the medium detection section.

According to the configuration, the first deviation amount, which is the deviation amount in the width direction between the medium and the recording head when the medium is transported in the direction in which the first surface becomes the recording surface, and the second deviation amount, which is the deviation amount in the width direction between the medium and the recording head when the medium is transported in the direction in which the second surface becomes the recording surface, can be acquired. For example, a person can manually adjust at least one of the first deviation amount and the second deviation amount by operating the adjustment mechanisms, or the control section can adjust the recording position of the recording head in the width direction.

C. The recording apparatus may include a display section that displays information on the deviation amount.

According to the configuration, the user can grasp the deviation amount on the display section. It is possible to appropriately perform adjustment to reduce the deviation in the width direction between the transported medium and the recording head.

D. In the recording apparatus, the medium mounting section may include a mounting section body on which the medium is mounted, a pair of edge guides that is assembled to be movable in the width direction with respect to the mounting section body and guides the medium to be positioned in the width direction, and an adjustment mechanism that can adjust an assembly position of the pair of edge guides to the mounting section body in the width direction.

According to the configuration, the assembly position of the pair of edge guides in the width direction is adjusted using the adjustment mechanisms and, such that it is possible to reduce the deviation amount. Therefore, it is possible to reduce the deviation in the width direction of the recording position where the recording head performs recording on the medium.

E. The recording apparatus may further include a control section that adjusts a recording position where the recording head performs the recording on the medium in the width direction by an adjustment amount corresponding to the deviation amount.

According to the configuration, the control section adjusts the recording position where the recording head performs recording on the medium in the width direction. Therefore, for example, manual work performed by a person using the adjustment mechanism can be eliminated or the frequency of manual work can be reduced.

F. In the recording apparatus, the medium detection section may detect the side edge of the medium transported in the direction in which the first surface becomes the recording surface and the side edge of the medium transported in the direction in which the second surface becomes the recording surface, the deviation amount acquisition section may acquire a first deviation amount, which is the deviation amount between the recording head and the medium transported in the direction in which the first surface becomes the recording surface, and a second deviation amount, which is the deviation amount between the recording head and the medium transported in the direction in which the second surface becomes the recording surface, and the recording apparatus may further includes a display section that displays the first deviation amount, and a control section that adjusts a recording position of the recording head in the width direction by an adjustment amount corresponding to the second deviation amount.

According to the configuration, the first deviation amount, which is the deviation amount in the width direction between the medium and the recording head when the medium is transported in the direction in which the first surface becomes the recording surface, and the second deviation amount, which is the deviation amount in the width direction between the medium and the recording head when the medium is transported in the direction in which the second surface becomes the recording surface, can be acquired. A person can manually adjust the first deviation amount by operating the adjustment mechanisms, and the control section can automatically adjust the second deviation amount by adjusting the recording position of the recording head in the width direction.

G. In the recording apparatus, the adjustment mechanism has a driving source, and the recording apparatus may further include a control section that controls the driving source to adjust the assembly position of the edge guide by an adjustment amount corresponding to the deviation amount.

According to the configuration, the adjustment by the adjustment mechanisms can be automated. Therefore, manual adjustment by a person can be completed less frequently or manual adjustment by a person can be eliminated.

H. In the recording apparatus, the medium detection section may include a sensor that is movable in the width direction at a position upstream in the transport direction from a nozzle of the recording head, and when the medium detection section performs a detection operation, the deviation amount acquisition section may set a position when the sensor is switched from a non-detection state to a detection state as a detection position of one side edge, and after a first integrated value, which is obtained by integrating the number of detection by the sensor from the detection position for each unit position, exceeds a threshold value set in advance according to a medium size, the medium detection section may set a position when the sensor is switched from the detection state to the non-detection state as a detection position of the other side edge.

According to the configuration, it is possible to detect the two side edge positions of the medium while suppressing erroneous detection caused by foreign matter such as paper dust. Therefore, erroneous detection of the deviation amount can be suppressed.

I. In the recording apparatus, the medium detection section may include a sensor that is movable in the width direction at a position upstream in the transport direction from a nozzle of the recording head, when the medium detection section performs a detection operation, the deviation amount acquisition section may set a position when the sensor is switched from a non-detection state to a detection state as a detection position of one side edge, and after a first measurement value, which is obtained by measuring a time or a distance detected by the sensor from the detection position, exceeds a threshold value set in advance according to a medium size, the medium detection section may set a position when the sensor is switched from the detection state to the non-detection state as a detection position of the other side edge.

According to the configuration, it is possible to detect the two side edge positions of the medium while suppressing erroneous detection caused by foreign matter such as paper dust. Therefore, erroneous detection of the deviation amount can be suppressed.

J. A method for suppressing a deviation of a recording position in a recording apparatus, in which the recording apparatus includes a medium mounting section that includes a mounting section body that can mount a medium and a pair of edge guides that guides the medium mounted on the mounting section body to be positioned in a width direction, a transport section that transports the medium mounted on the medium mounting section along a transport passage, and a recording head that performs recording on the medium, and suppresses a deviation in the width direction between the transported medium and the recording position to the medium, the method includes: transporting the medium mounted on the medium mounting section; detecting at least one of both side edges of the medium transported from the medium mounting section in the width direction intersecting the transport passage; acquiring a deviation amount of the medium in the width direction to the recording head based on a detection position of at least one of the detected side edges; and adjusting an assembly position of the edge guide to the mounting section body in the width direction according to the deviation amount.

According to the method, the deviation amount in the width direction between the transported medium and the recording head can be acquired, such that it is possible to appropriately perform adjustment to reduce the deviation in the width direction between the medium and the recording head.

What is claimed is:

1. A recording apparatus comprising:
   a medium mounting section that is configured to mount a medium;
   a transport section that transports the medium mounted on the medium mounting section;
   a recording head that performs recording on the medium;
   a medium detection section that detects at least one of both side edges of the medium transported from the medium mounting section in a width direction intersecting a transport direction of the medium; and
   a deviation amount acquisition section that acquires a deviation amount of the recording head in the width direction of the medium based on at least one side edge detection position detected by the medium detection section, wherein
   the medium mounting section includes
      a mounting section body on which the medium is mounted,
      a pair of edge guides that guides the medium mounted on the mounting section body to be positioned in the width direction, and
      an adjustment mechanism that is configured to adjust an assembly position of the pair of edge guides to the mounting section body in the width direction according to the deviation amount.

2. The recording apparatus according to claim 1, further comprising:
   a reverse transport path that reverses the medium after the recording is performed on a first surface of the medium, wherein
   the medium detection section detects the side edge of the medium in at least one of a first transport in which the medium is transported in a direction in which the first surface becomes a recording surface and a second transport in which the medium is transported in a direction in which a second surface, which is a surface opposite to the first surface, becomes the recording surface after the medium is transported through the reverse transport path and reversed, and
   the deviation amount acquisition section acquires the deviation amount in the width direction between the recording head and the medium whose side edge is detected by the medium detection section.

3. The recording apparatus according to claim 2, wherein the medium detection section detects the side edge of the medium transported in the direction in which the first surface becomes the recording surface and the side edge of the medium transported in the direction in which the second surface becomes the recording surface,
   the deviation amount acquisition section acquires a first deviation amount, which is the deviation amount between the recording head and the medium transported in the direction in which the first surface becomes the recording surface, and a second deviation amount, which is the deviation amount between the recording head and the medium transported in the direction in which the second surface becomes the recording surface, and
   the recording apparatus further includes:
      a display section that displays the first deviation amount; and
      a control section that adjusts a recording position of the recording head in the width direction by an adjustment amount corresponding to the second deviation amount.

4. The recording apparatus according to claim 1, further comprising:
   a display section that displays information on the deviation amount.

5. The recording apparatus according to claim 1, wherein the pair of edge guides is assembled to be movable in the width direction with respect to the mounting section body.

6. The recording apparatus according to claim 5, wherein the adjustment mechanism has a driving source, and
   the recording apparatus further includes a control section that controls the driving source to adjust the assembly position of the edge guide by an adjustment amount corresponding to the deviation amount.

7. The recording apparatus according to claim 5, wherein the adjustment mechanism includes a scale that has a range set according to a movement range of the assembly position of the pair of edge guides, and
   a pointer that can visually recognize an adjustment amount when the assembly position of the pair of edge guides is adjusted based on the change in position on the scale.

8. The recording apparatus according to claim 1, further comprising:
   a control section that adjusts a recording position where the recording head performs the recording on the medium in the width direction by an adjustment amount corresponding to the deviation amount.

9. The recording apparatus according to claim 1, wherein the medium detection section includes a sensor that is movable in the width direction at a position upstream in the transport direction from a nozzle of the recording head, and
   when the medium detection section performs a detection operation, the deviation amount acquisition section sets a position when the sensor is switched from a non-detection state to a detection state as a detection position of one side edge, and after a first integrated value, which is obtained by integrating the number of detection by the sensor from the detection position for each unit position, exceeds a threshold value set in advance according to a medium size, the medium detection section sets a position when the sensor is switched from the detection state to the non-detection state as a detection position of the other side edge.

10. The recording apparatus according to claim 1, wherein the medium detection section includes a sensor that is movable in the width direction at a position upstream in the transport direction from a nozzle of the recording head, and when the medium detection section performs a detection operation, the deviation amount acquisition section sets a position when the sensor is switched from a non-detection state to a detection state as a detection position of one side edge, and after a first measurement value, which is obtained by measuring a time or a distance detected by the sensor from the detection position, exceeds a threshold value set in advance according to a medium size, the medium detection section sets a position when the sensor is switched from the detection state to the non-detection state as a detection position of the other side edge.

11. The recording apparatus according to claim 1, wherein the pair of edge guides is located facing each other in the width direction of the medium and slidable to change an interval between them facing each other.

12. A method for suppressing a deviation of a recording position in a recording apparatus, in which the recording apparatus includes a medium mounting section that includes a mounting section body that is configured to mount a medium and a pair of edge guides that guides the medium mounted on the mounting section body to be positioned in a width direction, a transport section that transports the medium mounted on the medium mounting section along a transport passage, and a recording head that performs recording on the medium, and suppresses a deviation in the width direction between the transported medium and the recording position to the medium, the method comprising:

transporting the medium mounted on the medium mounting section;

detecting at least one of both side edges of the medium transported from the medium mounting section in the width direction intersecting the transport passage;

acquiring a deviation amount of the medium in the width direction to the recording head based on a detection position of at least one of the detected side edges; and adjusting an assembly position of the edge guide to the mounting section body in the width direction according to the deviation amount.

13. A recording apparatus comprising:

a medium mounting section that is configured to mount a medium;

a transport section that transports the medium mounted on the medium mounting section;

a recording head that performs recording on the medium;

a medium detection section that detects at least one of both side edges of the medium transported from the medium mounting section in a width direction intersecting a transport direction of the medium; and a deviation amount acquisition section that acquires a deviation amount of the recording head in the width direction of the medium based on at least one side edge detection position detected by the medium detection section, wherein the medium detection section includes a sensor that is movable in the width direction at a position upstream in the transport direction from a nozzle of the recording head, and when the medium detection section performs a detection operation, the deviation amount acquisition section sets a position when the sensor is switched from a non-detection state to a detection state as a detection position of one side edge, and after a first integrated value, which is obtained by integrating the number of detection by the sensor from the detection position for each unit position, exceeds a threshold value set in advance according to a medium size, the medium detection section sets a position when the sensor is switched from the detection state to the non-detection state as a detection position of the other side edge.

* * * * *